(12) United States Patent
Whetsel

(10) Patent No.: US 8,880,968 B2
(45) Date of Patent: Nov. 4, 2014

(54) INTERPOSER HAVING FUNCTIONAL LEADS, TAP, TRIGGER UNIT, AND MONITOR CIRCUITRY

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 306 days.

(21) Appl. No.: 13/447,465

(22) Filed: Apr. 16, 2012

(65) Prior Publication Data

US 2012/0278674 A1 Nov. 1, 2012

Related U.S. Application Data

(60) Provisional application No. 61/479,189, filed on Apr. 26, 2011.

(51) Int. Cl.
*G01R 31/28* (2006.01)
*G01R 31/3185* (2006.01)
*G01R 31/3177* (2006.01)

(52) U.S. Cl.
CPC .... *G01R 31/318533* (2013.01); *G01R 31/3177* (2013.01); *G01R 31/318536* (2013.01)
USPC ............ 714/733; 714/727; 714/729; 714/724

(58) Field of Classification Search
CPC ....................... G01R 31/31856; G01R 31/3177
USPC .......................... 714/724, 726, 727, 729, 733
See application file for complete search history.

(56) References Cited

U.S. PATENT DOCUMENTS

| 5,517,515 | A  | * | 5/1996  | Spall et al. ..................... 714/733 |
| 6,160,408 | A  | * | 12/2000 | Fenton ...................... 324/754.11 |
| 7,518,398 | B1 | * | 4/2009  | Rahman et al. .................. 326/38 |
| 8,273,610 | B2 | * | 9/2012  | Or-Bach et al. ............... 438/142 |
| 2011/0148456 | A1 | * | 6/2011 | Mooyman-Beck et al. ........................ 324/762.02 |

OTHER PUBLICATIONS

TDB NB9404105 "Customable Multi-Contact-Point Interposer" IBM Technical Disclosure Bulletin, Apr. 1994 vol. 37 issue 4B p. 105-106.*
Namhoon Kim; Wu, D.; Dongwook Kim; Rahman, A.; Wu, P., "Interposer design optimization for high frequency signal transmission in passive and active interposer using through silicon via (TSV)," Electronic Components and Technology Conference (ECTC), 2011 IEEE 61st , vol., No., pp. 1160,1167, May 31, 2011-Jun. 3, 2011.*
Rao, V.S.; Ho Soon Wee; Vincent, L.; Hong Yu; Liao Ebin; Nagarajan, R.; Chai Tai Chong; Xiaowu Zhang; Damaruganath, P., "TSV interposer fabrication for 3D IC packaging," Electronics Packaging Technology Conference, 2009. EPTC '09. 11th , vol., No., pp. 431,437, Dec. 9-11, 2009.*

* cited by examiner

*Primary Examiner* — Cynthia Britt
(74) *Attorney, Agent, or Firm* — Lawrence J. Bassuk; Frederick J. Telecky, Jr.

(57) ABSTRACT

The disclosure describes a novel method and apparatus for improving interposers to include embedded monitoring instruments for real time monitoring digital signals, analog signals, voltage signals and temperature sensors located in the interposer. An embedded monitor trigger unit controls the starting and stopping of the real time monitoring operations. The embedded monitoring instruments are accessible via an 1149.1 TAP interface on the interposer.

5 Claims, 27 Drawing Sheets

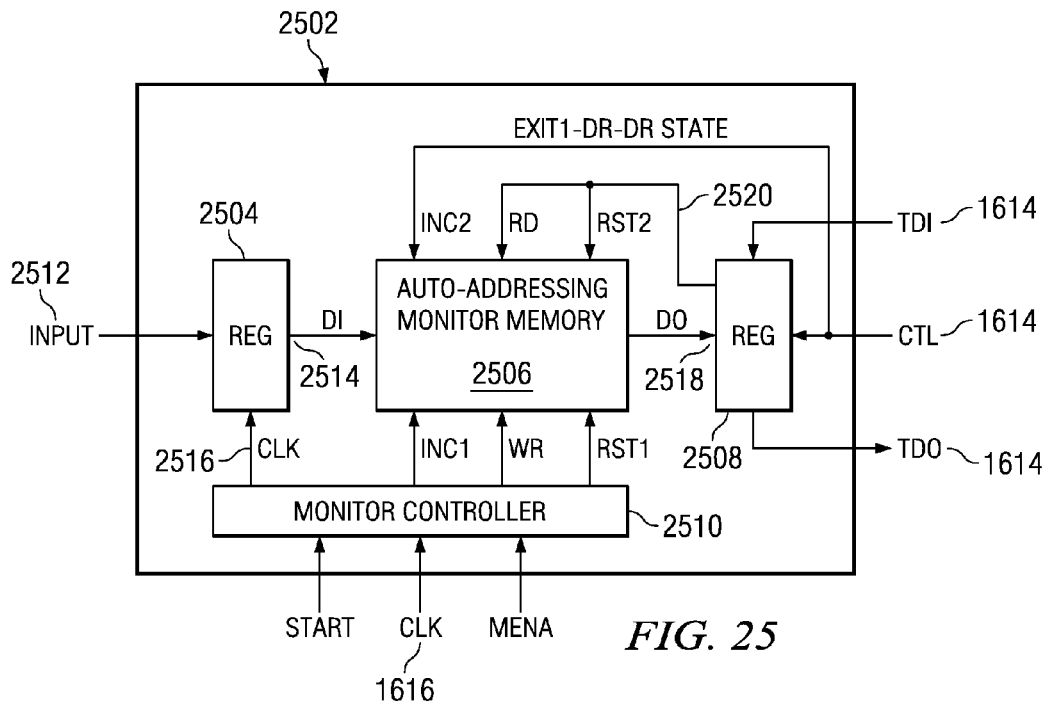
*FIG. 25*
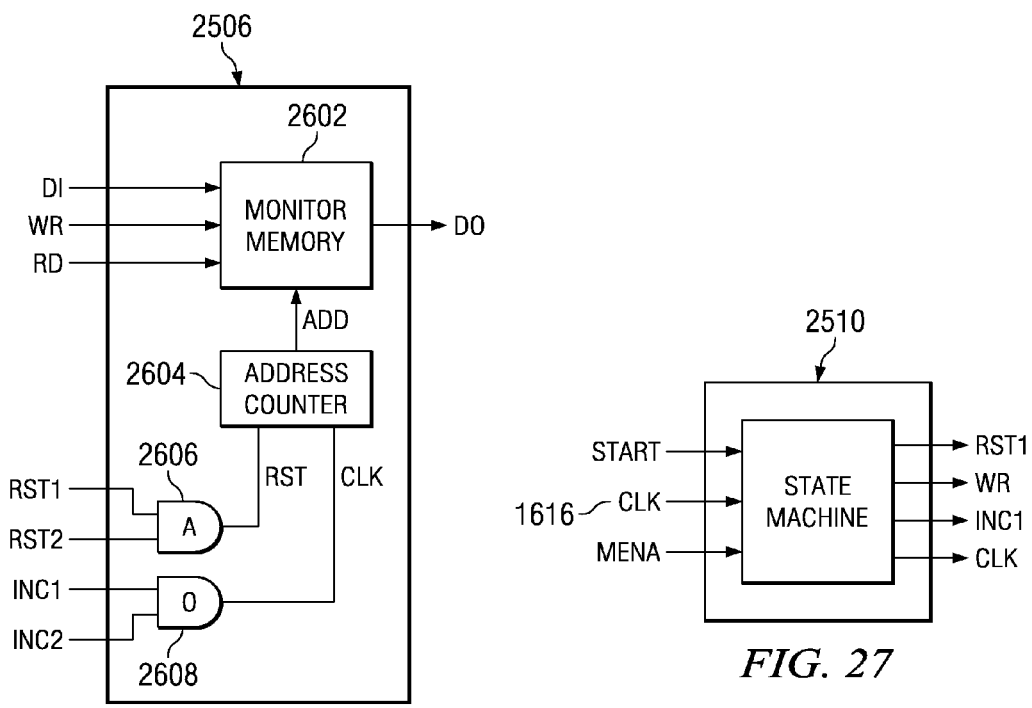
*FIG. 26*
*FIG. 27*

US 8,880,968 B2

INTERPOSER HAVING FUNCTIONAL LEADS, TAP, TRIGGER UNIT, AND MONITOR CIRCUITRY

FIELD OF THE DISCLOSURE

This disclosure claims priority from Provisional Application No. 61/479,189, filed Apr. 26, 2011.

This disclosure relates generally to instrumentation circuits and in particular to the implementation of instrumentation circuits within silicon interposers.

BACKGROUND OF THE DISCLOSURE

Integrated circuits (ICs) may be designed to include embedded instruments for monitoring activities and conditions within the IC. Access to embedded IC instruments is typically achieved via the dedicated terminals of the IC's IEEE 1149.1 Test Access Port (TAP) interface.

FIG. 1 illustrates an example integrated circuit die 102 that includes functional circuits such as but not limited too, a microcontroller unit (MCU) 104 circuit core, a digital signal processor (DSP) 106 circuit core, memory circuit cores 108 and other functional digital or analog circuit cores 110. The IC's functional circuits are coupled together via an internal functional input and/or output (FIO) bus 112 to allow them to communicate with each other. The IC has external FIO signal terminals 114 to allow the functional circuits of IC 102 to communicate with functional circuits of other ICs.

FIG. 2 illustrates an example integrated circuit die that includes the functional circuits of die 102 plus the well known IEEE 1149.1 TAP 204, boundary register (BR) 206 and TAP input/output (TIO) interface 208. The TIO interface 208 includes TDI, TCK, TMS input signals and a TDO output signal. The TAP 204 responds to the TCK and TMS signals to input data from TDI and output data to TDO. If the boundary register 206 is selected for access it will shift data from TDI to TDO. During normal operation of the die 202, the boundary register couples the internal FIO bus signals 112 to the external FIO signals 114 to allow the die to functionally operate with other die. During boundary scan test mode using the well known 1149.1 Extest instruction, the boundary register isolates the internal FIO buss signals 112 from the external FIO signals 114. In the boundary scan Extest mode the boundary register can be operated by the TAP to perform interconnect testing between the external FIO signals 114 of die 202 and the FIO signals 114 of die connected to die 202.

FIG. 3 illustrates the TAP 204 of die 202 in more detail. The 1149.1 TAP includes, at minimum, a TAP state machine (TSM) 302, an instruction register 304, a Bypass Register 306, the Boundary Register 206 and a TDO output multiplexer circuitry 308. The TSM 304 operates according to the well known 16 state transition diagram of FIG. 4 in response to the TCK and TMS input signals to; (1) place the TAP in a Test Logic Reset state, (2) place the TAP in a Run Test/Idle state, (3) perform a scan operation to the instruction register from TDI to TDO, (4) to perform a data scan operation to the Bypass Register 308 from TDI to TDO or (4) perform a data scan operation to the Boundary Register 206 from TDI to TDO. The 1149.1 interface may include an optional TRST input, shown in dotted line, to reset the TSM and other TAP circuits. If the TRST input is not included, a Power Up Reset (POR) circuit 310 may be used to reset the TSM and other TAP circuits.

During instruction scan operations, the TSM outputs control (CTL) signals to the instruction register 304 and multiplexer circuitry 308. In response to the CTL signals the instruction register performs capture, shift and update operations. During the shift operation the instruction register shifts data from TDI to TDO via multiplexer 308.

During data scan operations, the TSM outputs CTL signals to the selected data register 306 or 206 and multiplexer 308. The instruction register output (IRO) bus enables the selected data register and controls multiplexer 308 to couple the TDO output of the selected data register to the TDO output of the die. In response to the CTL signals the selected data register performs capture, shift and update operations, except for the Bypass Register 306 which does not have update circuitry. During the shift operation the selected data register shifts data from TDI to TDO via multiplexer 308.

FIG. 5 illustrates an example integrated circuit die 502 that includes the functional circuits and IEEE 1149.1 TAP circuits of die 202 plus embedded instrumentation circuits 504. As seen, the embedded instrumentation circuits may exist as part of the functional circuits 104-110 of the die or they may exist as separate circuits on the die. In this example, access to the instrumentation circuits is achieved via the TAP of die 502. The instrumentation circuits may provide any type of operations on the die, including but not limited too, test operations, debug operation, trace operations, temperature monitoring operations and voltage monitoring operations.

FIG. 6 illustrates a first known example of how the TAP 204 may access the instruments 504 of die 502 of FIG. 5. In this example, each instrument 1–N is separately accessed between TDI and TDO by loading the TAP instruction register with an instruction that accesses a selected one of the instruments 1–N.

FIG. 7 illustrates a second known example of how the TAP 204 may access the instruments 504 of die 502 of FIG. 5. In this example, all instruments 1–N are accessed together in series between TDI and TDO by loading the TAP instruction register with an instruction that accesses all the serially connected instruments 1–N.

FIG. 8 illustrates a third known example of how the TAP 204 may access the instruments 504 of die 502 of FIG. 5. In this example, each instrument 1–N is interfaced to a segment insertion bit (SIB) 802-804 that can select its associated instrument for access or deselect its associated instrument from access. All the SIBs are serially connected together to form a data register. The SIB data register is selected between TDI and TDO by an instruction loaded in the TAP instruction register. When no instruments are selected the SIB data register consists only of a single bit for each SIB. For example if 5 SIBs exist in the SIB data register, the length of the data register will be 5 bits. When the bit of a SIB is loaded with a logic state for selecting its instrument, its instrument is included in the SIB data register between TDI and TDO. For example, if the bit of SIB 802 is set to a state that selects its instrument (i.e. Instrument 1), the SIB data register between TDI and TDO will be lengthened to included the length the register within Instrument 1. Using the SIBs, any of the instruments 1–N may be included into the SIB data register or excluded from the SIB data register. This instrumentation access example is the subject of a developing IEEE instrumentation access standard P1681. The concept of using SIB-like circuits (DSMs) for varying the length of a serial scan path was first described 1987 in U.S. Pat. No. 4,872,169.

FIG. 9 illustrates a device 902 comprising a stack of die 904-908 mounted upon a silicon interposer 910. The interposer 910 is further mounted to system substrate 912, such as, but not limited too, a smart phone printed circuit board (PCB), a PC PCB or another die. The die 904-908 in this example are designed using through silicon vias (TSV) 914. TSVs are connectivity paths formed between the top and bottom surfaces of the die. TSVs allow substrate signals to flow vertically up and down the die stack via the interposer 912 to provide input to and output from the circuitry in each die. The die circuitry of this example only contains functional circuitry as described in FIG. 1. Thus only FIO signals pass between the substrate 912 and the stacked die 904-908. The function of interposers is to spread connections from fine pitch contact points on one surface to wider pitch contact points on another surface. In this example, the fine pitch contact points on the bottom surface of die 904 are spread to match the wider pitch contacts points of the system substrate 912, via interposer 912.

FIG. 10 illustrates a device 1002 comprising a stack of die 1004-1008 mounted upon a silicon interposer 1010. The interposer 1010 is further mounted to system substrate 1012. As in the device 902 of FIG. 9, the die 1004-1008 in this example are designed using TSVs 914. The die circuitry of this example contains functional circuitry and TAP circuitry as described in FIGS. 2-4. Thus both FIO and TIO signals pass between the substrate 1012 and the stacked die 1004-1008. The TAP circuitry may provide access to embedded instruments on the die as described in FIGS. 5-8.

FIG. 11 illustrates a first method of providing the TIO (TCK, TMS, TDI and TDO) signals between the TAPs of die 1004-1008 and the substrate 1012. In this example, the substrate provides a dedicated TCK, TMS, TDI and TDO signal interface to each die so that each die TAP can be accessed separately. The problem with this method is that the substrate is required to include separate TIO busses for each die.

FIG. 12 illustrates a second method of providing the TIO signals between the TAPs of die 1004-1008 and the substrate 1012. In this example, the substrate provides a common TCK, TDI and TDO signal connections to each die TAP and separate a TMS signal to each die TAP. This example is commonly referred to as a STAR connection. To access the TAP of die 1004, its TMS signal becomes active to shift data in and out via TDI and TDO. To access the TAP of die 1006, its TMS signal becomes active to shift data in and out via TDI and TDO. To access the TAP of die 1008, its TMS signal becomes active to shift data in and out via TDI and TDO. The problem with this method is that the substrate is required to include a separate TMS signal for each die.

FIG. 13 illustrates a third method of providing the TIO signals between the TAPs of die 1004-1008 and the substrate 1012. In this example, the substrate provides common TCK and TMS signal connections to each die TAP, a TDI connection to die 1004 and a TDO connection to die 1008. The TDO signal of die 1004 is connected 1304 to the TDI signal of die 106 and the TDO signal of die 106 is connected 1306 to the TDI signal of die 1008. To access the serially connected TAPs of die 1004-108, the TCK and TMS signals become active to shift data into the serially connected die TAPs from the substrates TDI input to the TDO output. The problem with accessing device 1302 using this method is that serially connecting multiple TAPs together in a device is not compliant with the IEEE 1149.1 standard. IEEE 1149.1 expects a device to only have one instruction register and one bypass register connected between the devices TDI and TDO terminals.

The following disclosure describes a new method of providing instrumentation circuitry in devices that include stacked die mounted on interposers.

BRIEF SUMMARY OF THE DISCLOSURE

This disclosure describes an interposer that is improved to include instrumentation and IEEE 1149.1 TAP circuitry. The instrumentation equipped interposer can be used in devices in place of conventional interposers.

BRIEF DESCRIPTION OF THE VIEWS OF THE DRAWINGS

FIG. 25 illustrates the general architecture of the monitors of the present disclosure.
FIG. 26 illustrates the auto-address monitor memory of the monitor architecture of FIG. 25.
FIG. 27 illustrates the monitor controller state machine of the monitor architecture of FIG. 25.

DETAILED DESCRIPTION OF THE DISCLOSURE

Figure 1:
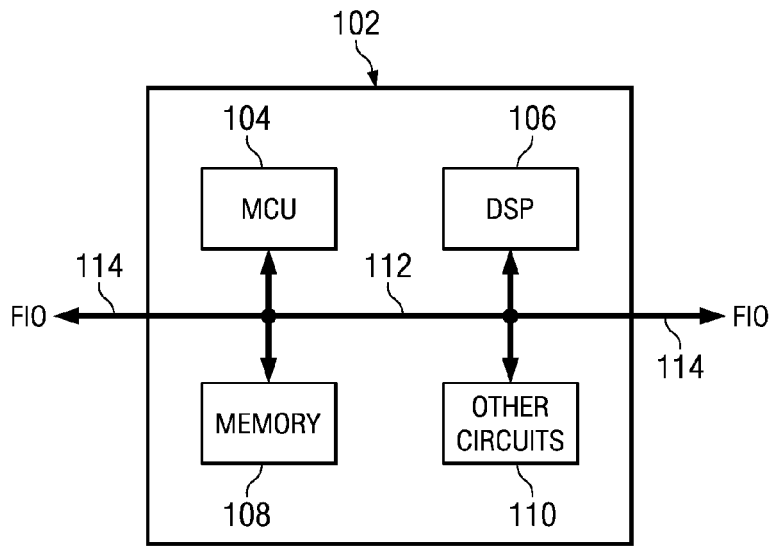
FIG. 1 illustrates an integrated circuit die.
Figure 2:
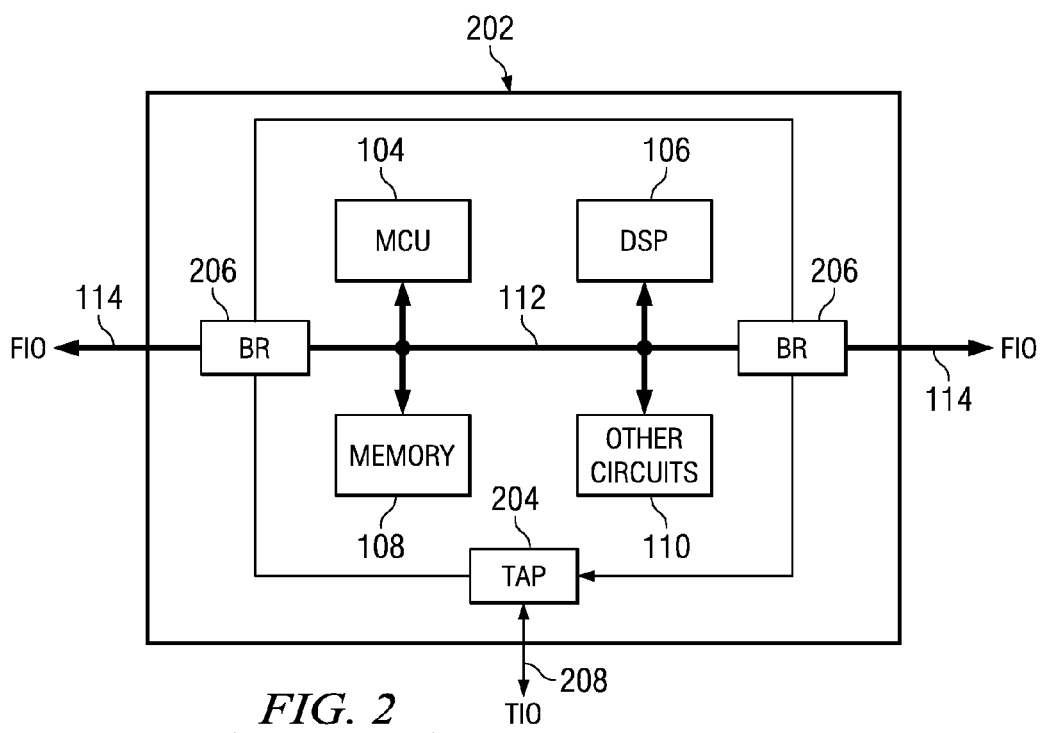
FIG. 2 illustrates an integrated circuit die with IEEE 1149.1 TAP circuitry.
Figure 3:
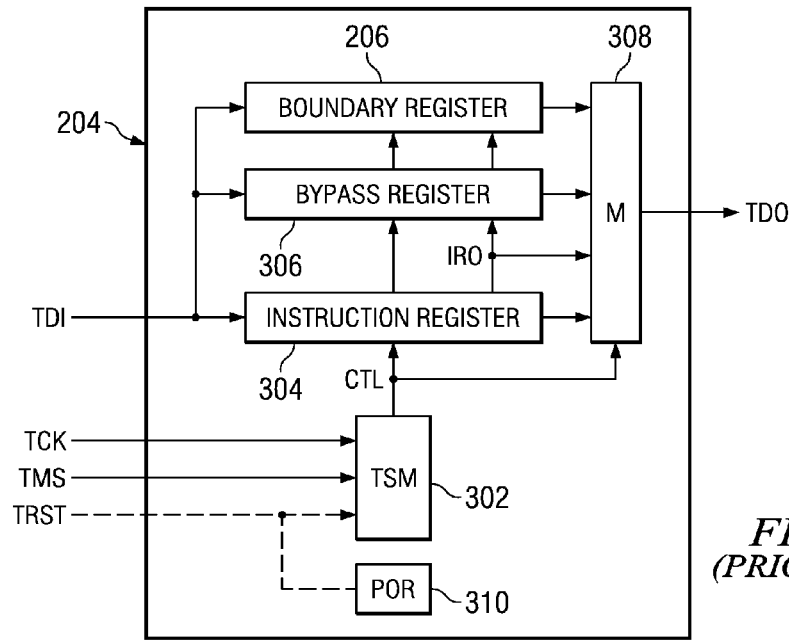
FIG. 3 illustrate an IEEE 1149.1 TAP.
Figure 5:
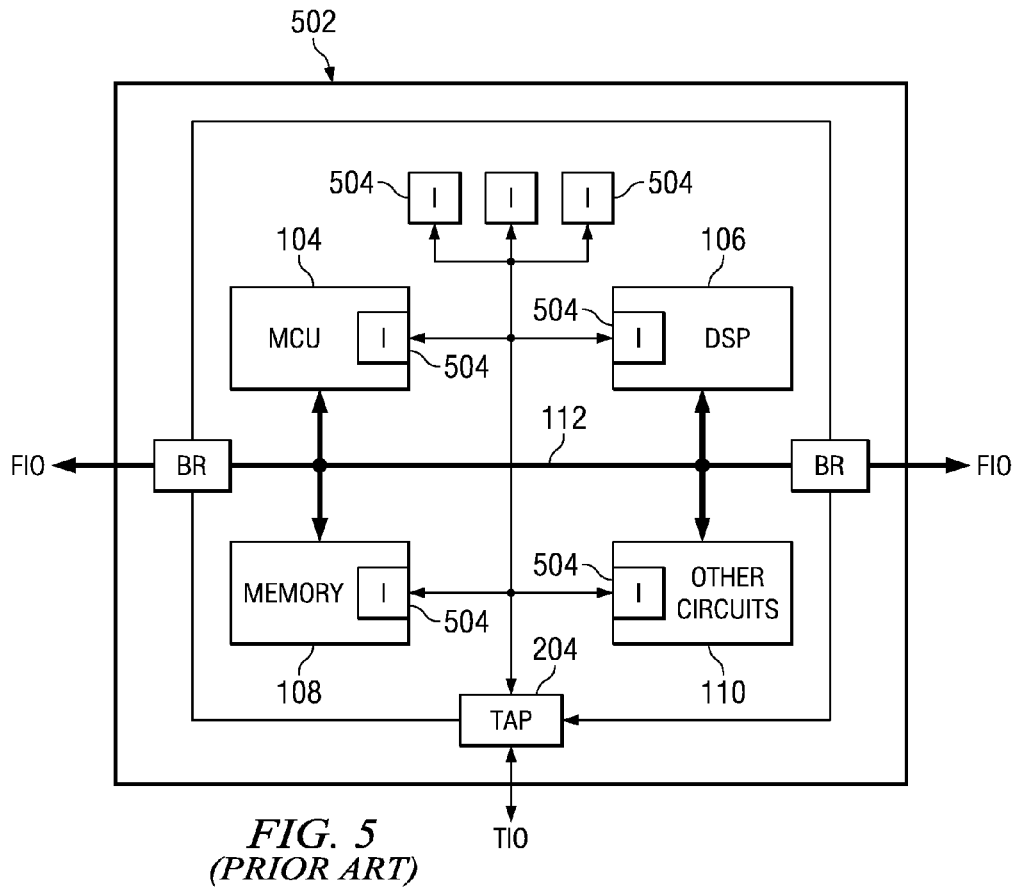
FIG. 5 illustrates a die containing a TAP and embedded instruments.
Figure 14:
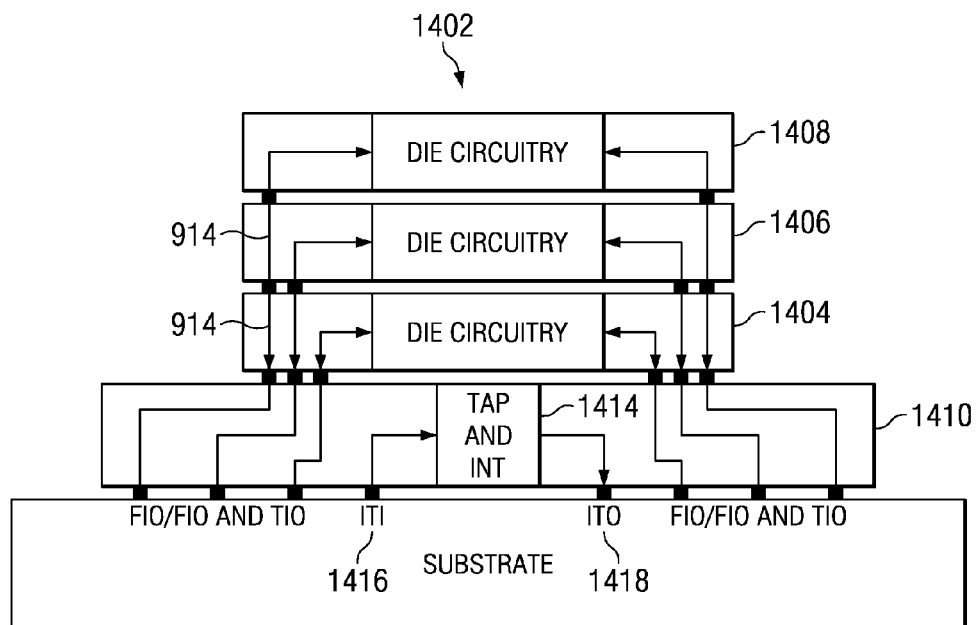
FIG. 14 illustrates the interposer of the present disclosure located between a substrate and a die stack.

FIG. 14 illustrates a device 1402 comprising stacked die 1404-1408 and an interposer 1410. The die in the stack may only include functional circuitry that require FIO signal connections to the substrate as described in FIG. 1 or they may include functional and TAP circuitry that require FIO and TIO signal connections to the substrate as described in FIGS. 2 and 5. The interposer is similar to the previously described interposers in that it provides connectivity between the stacked die and a system substrate 1412 for the FIO or FIO and TIO signals. Interposer 1410 differs from the previously described interposers in that it is enhanced to include TAP and instrumentation circuitry (TAP&INT) 1414. The interposer TAP&INT circuitry 1414 is connected to the substrate via interposer TAP input (ITI) 1416 and interposer TAP output (ITO) 1418 signals to allow accessing the TAP&INT circuitry.

Figure 6:
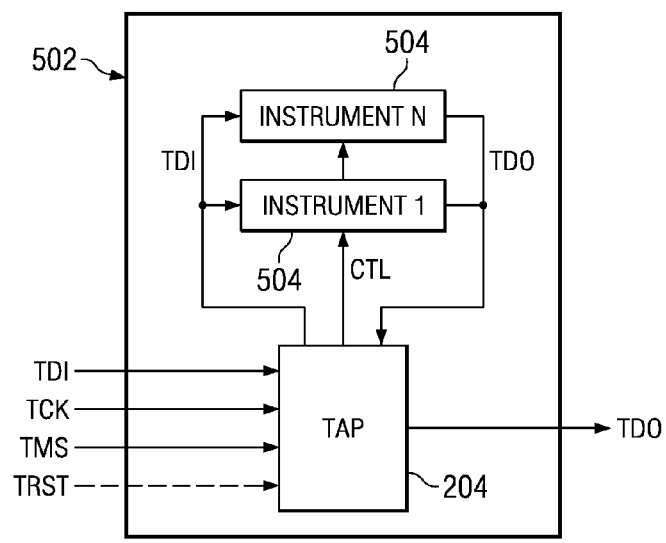
FIG. 6 illustrates a first TAP access method to instruments in a die.
Figure 7:
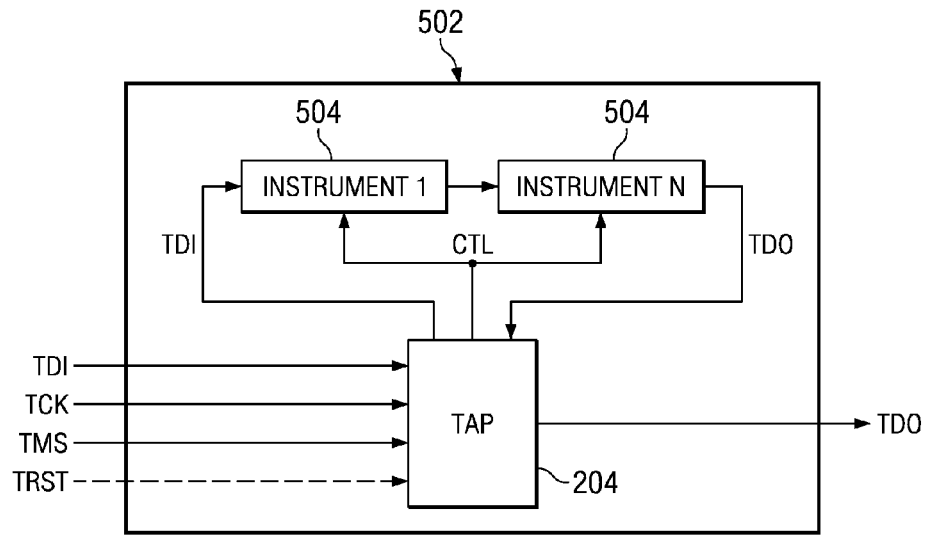
FIG. 7 illustrates a second TAP access method to instruments in a die.
Figure 8:
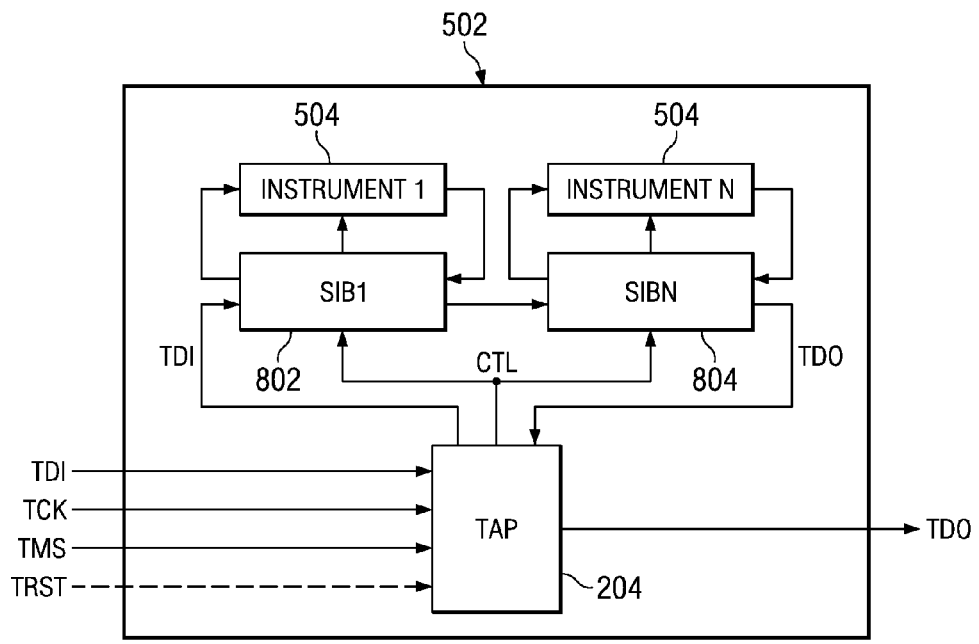
FIG. 8 illustrates a third TAP access method to instruments in a die.
Figure 9:
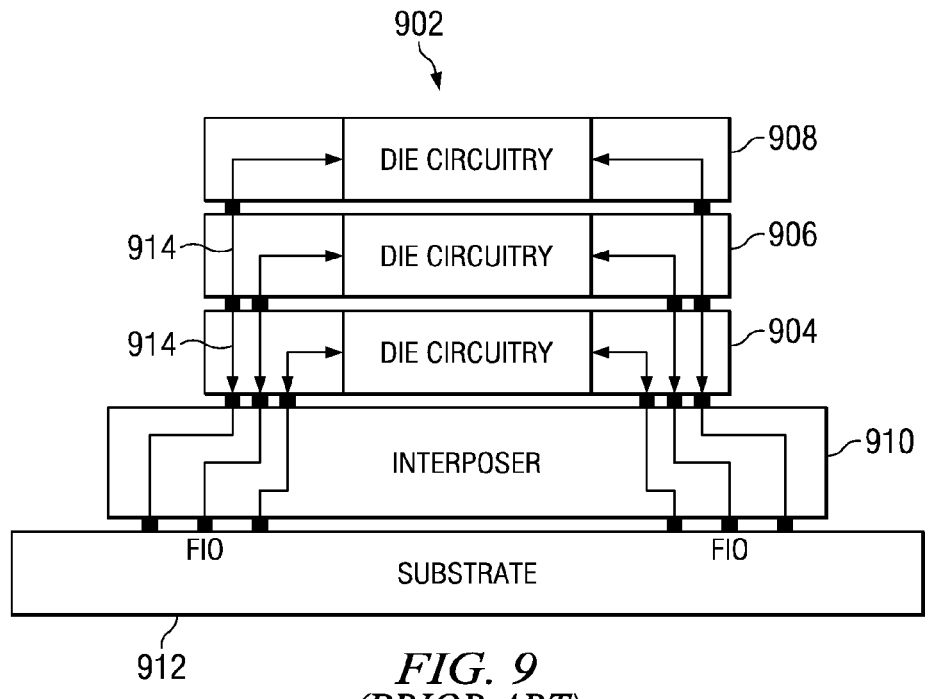
FIG. 9 illustrates a substrate with functional inputs and outputs connected to a stacked die via an interposer.
Figure 10:
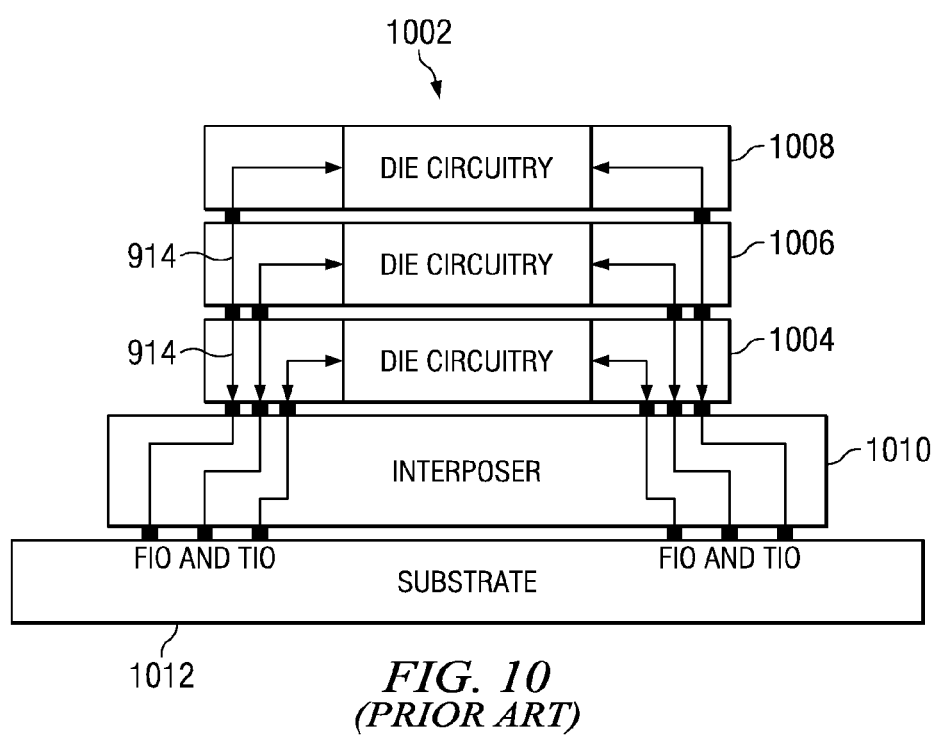
FIG. 10 illustrates a substrate with functional and test inputs and outputs connected to a stacked die via an interposer.
Figure 11:
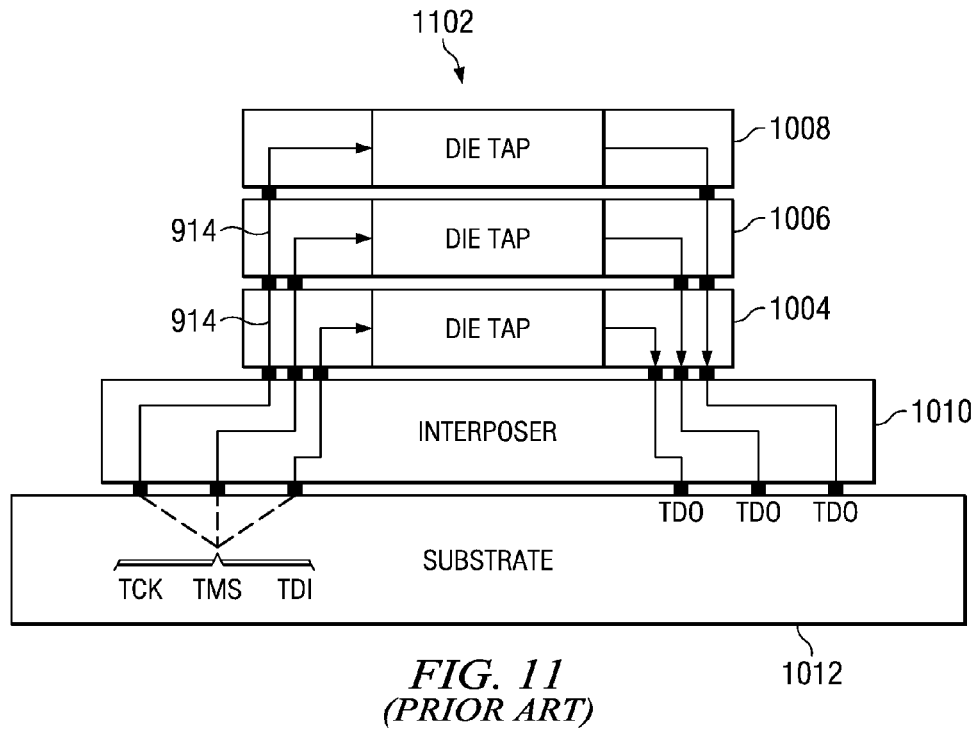
FIG. 11 illustrates a first method of accessing TAPs in a stacked die via an interposer.
Figure 12:
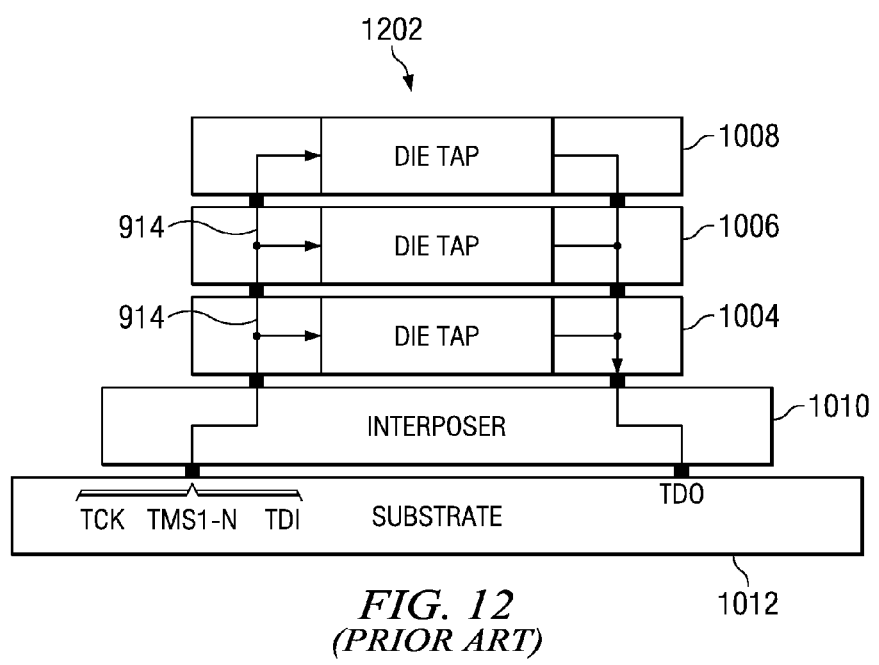
FIG. 12 illustrates a second method of accessing TAPs in a stacked die via an interposer.
Figure 13:
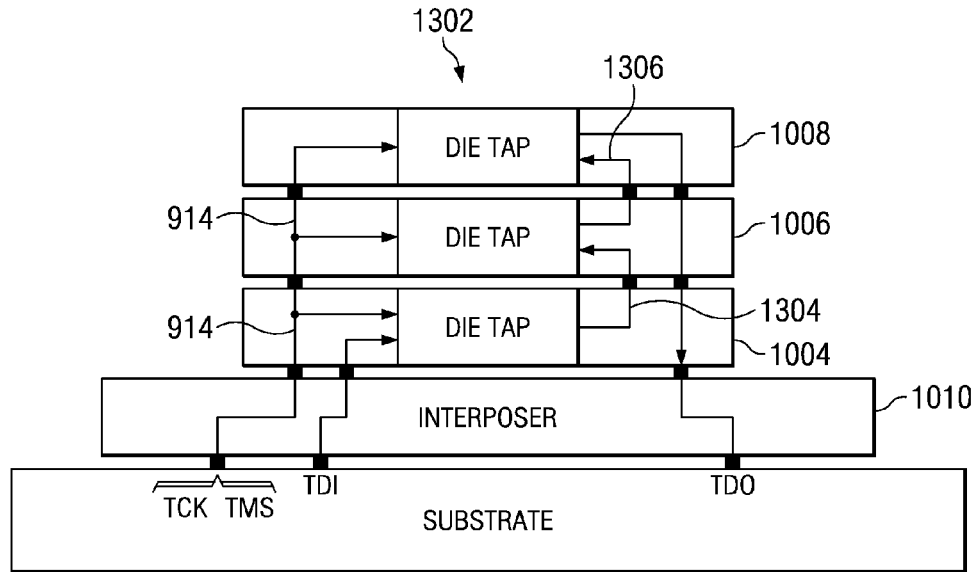
FIG. 13 illustrates a third method of accessing TAPs in a stacked die via an interposer.
Figure 15:
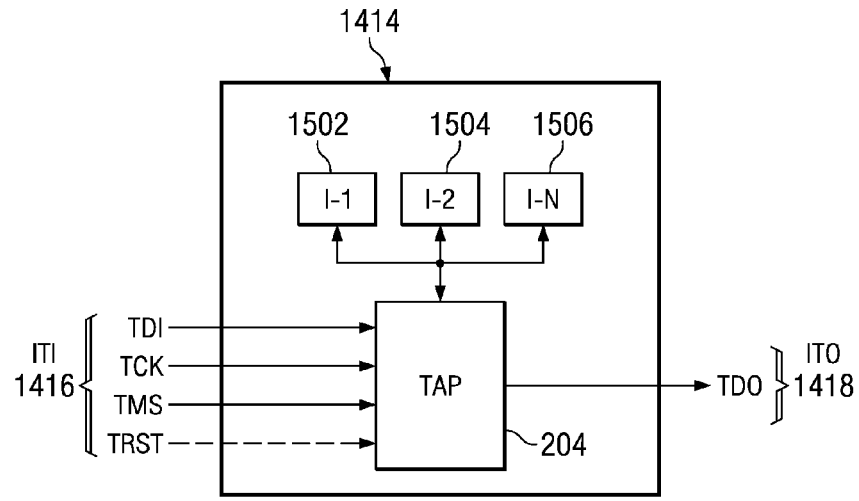
FIG. 15 illustrates the TAP access to instrumentation monitors included in the interposer of FIG. 14.

FIG. 15 illustrates the interposer 1410 TAP&INT circuitry 1414 in more detail. As seen the TAP&INT circuitry 1414 includes a TAP 204 and a number of instruments (I1-N) 1502-1504. The TAP 204 receives the ITI 1416 inputs (TDI, TCK, TMS and optionally TRST) from the substrate 1412 and outputs the ITO 1418 output (TDO) to the substrate. The TAP may access the instruments 1-N using any of the access approaches described in FIGS. 6-8. While any type of instrument may be implemented in the interposer 1410, this disclosure describes non-intrusive type instruments that passively monitor activities and conditions occurring in the device using the interposer 1410.

Figure 16:
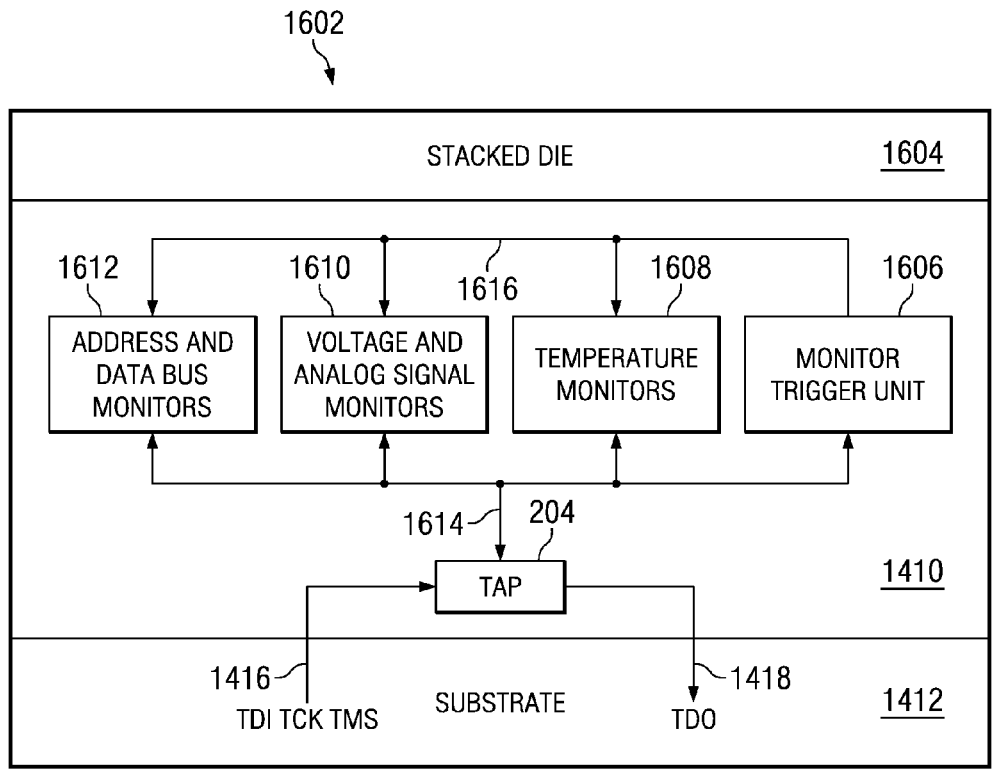
FIG. 16 illustrates a more detail view of the TAP and instrumentation monitors of FIG. 14.

FIG. 16 illustrates a device 1602 including an example interposer of the disclosure located between stacked die 1604 and a system substrate 1412. The interposer's TAP 204 provides access, via interface 1614, to a Monitor Trigger Unit 1606, Temperature Monitors 1608, Voltage & Analog Signal Monitors 1610 and Address & Data Bus Monitors 1612. The purpose of the Monitor Trigger Unit 1606 is to provide control, via bus 1616, to enable and operate the monitors 1608-1612. The purpose of the Temperature Monitors 1608 is to monitor temperature conditions of the device containing the interposer 1410. The purpose of the Voltage & Analog Signal Monitors 1610 is to monitor voltages and analog signal activity of the device containing the interposer 1410. The purpose of the Address & Data Bus Monitors 1612 is to monitor digital signal activity of address and data busses of the device containing the interposer 1410.

Figure 17:
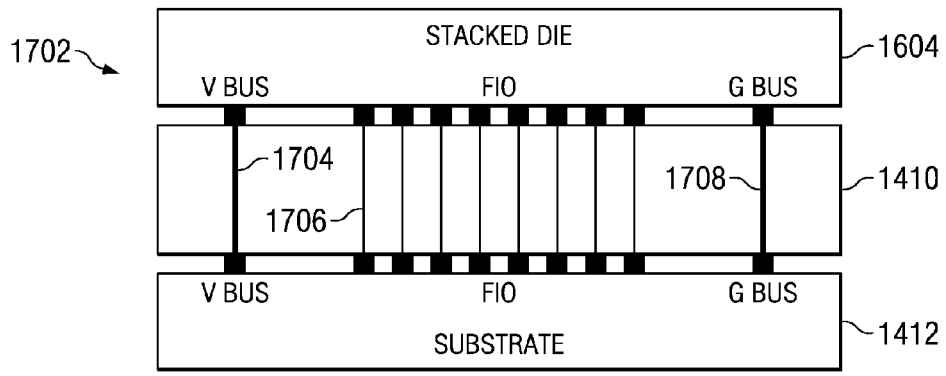
FIG. 17 illustrates voltage, ground and functional input and/or outputs connections of the interposer of the present disclosure.

FIG. 17 illustrates a device 1702 wherein the interposer 1410 of the disclosure provides a voltage bus connection (V Bus) 1704, a ground bus connection (G Bus) 1708 and functional input and/or output (FIO) signal connections 1706 between a substrate 1412 and stacked die 1604. The FIO connections can transfer digital or analog signals between the substrate and stacked die. The V Bus and G Bus connections to the substrate 1412 provide power and groude to the stacked die and to circuitry (TAP and instrumentation circuitry) in the interposer 1410. Multiple V Bus and G Bus connections may exist. The multiple V Bus connections may provide the same or different voltage levels.

Figure 18:
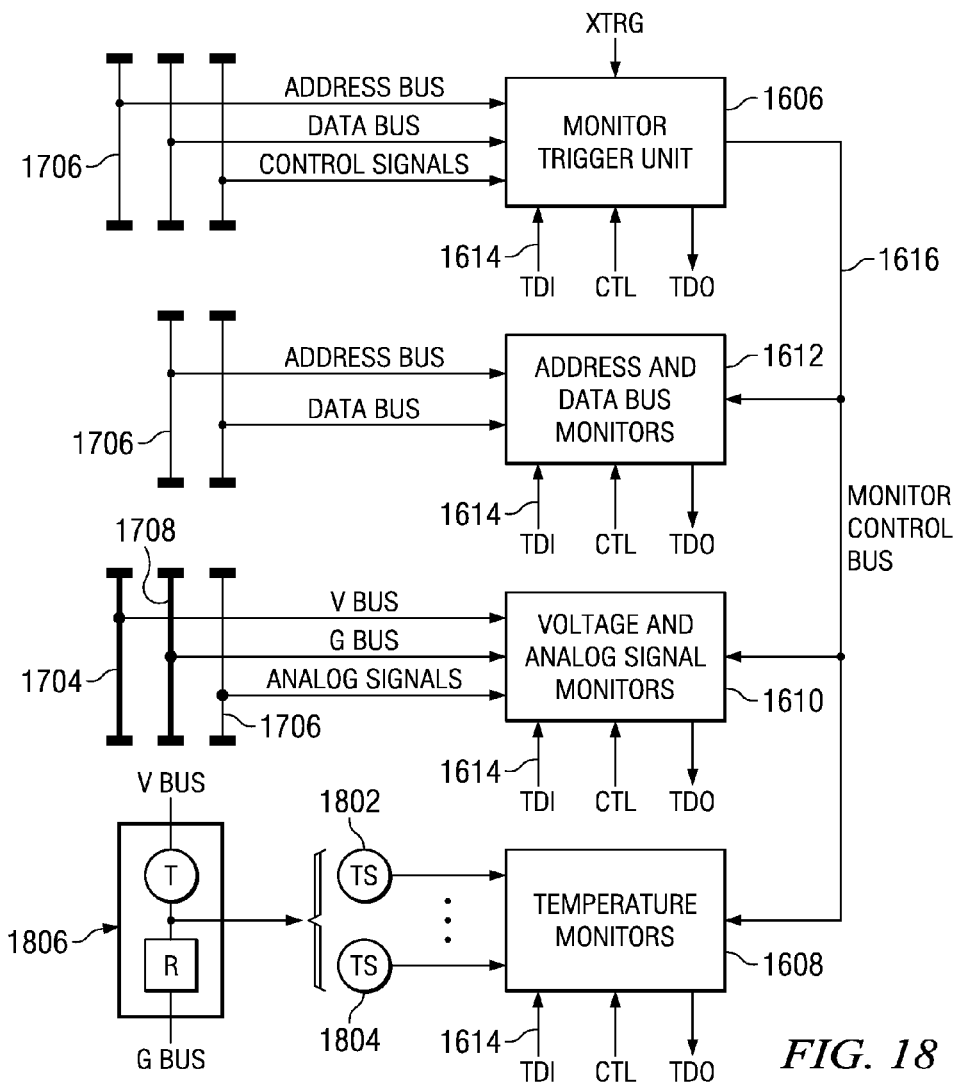
FIG. 18 illustrates the trigger unit and monitors of the present disclosure coupled to address, data, control, VB, GB, analog signals and temperature sensors within the interposer.

FIG. 18 illustrates a view of how the Monitor Trigger Unit 1606 and monitors 1608-1612 are coupled to the FIO 1706 connections and V & G Buses 1704 and 1708 existing in interposer 1410 of FIG. 17.

The Monitor Trigger Unit 1606 has inputs coupled to functional address bus, functional data bus and functional control signals on the FIO connections 1706 of interposer 1410. The functional control signals may include functional clock signals that time functional circuietry, functional read/write signals that time memory read and/or write operations, or other types of functional timing signals, such as but not limited too, oscillators and phase lock loop clock outputs. The Trigger Unit 1606 also has an input connected to an optional external trigger (XTRG) signal and inputs and an output coupled to the TDI, CTL and TDO interface 1604 of TAP 204 of interposer 1410. The XTRG signal may come from the stacked die 1604, the substrate 1412 or a circuit existing in the interposer 1410. The Monitor Trigger Unit 1606 has a monitor control bus 1616 to control the operation of the monitors within interposer 1410.

The Address & Data Bus Monitor 1612 has inputs coupled to functional address and data buses on the FIO connections 1706 of interposer 1410. The Bus Monitor 1612 also has inputs and an output coupled to the TDI, CTL and TDO interface 1604 of TAP 204 of interposer 1410. The Bus Monitor has inputs connected to the monitor control bus 1616 from Trigger Unit 1606.

The Voltage & Analog Signal Monitor 1610 has inputs coupled to V bus 1704, G Bus 1708 and functional analog signals on the FIO connections 1706 of interposer 1410. The Voltage & Analog Signal Monitor 1610 also has inputs and an output coupled to the TDI, CTL and TDO interface 1604 of TAP 204 of interposer 1410. The Voltage & Analog Signal Monitor has an inputs connected to the monitor control bus 1616 from Trigger Unit 1606.

The Temperature Monitor 1608 has inputs coupled to temperature sensors (TS) 1802 that may exist in the interposer 1410, in the substrate 1412 or in the die stack 1604. The Temperature Monitor 1608 also has inputs and an output coupled to the TDI, CTL and TDO interface 1604 of TAP 204 of interposer 1410. The Temperature Monitor has inputs connected to the monitor control bus 1616 from Trigger Unit 1606. One common type of temperature sensor 1806 that could be used to monitor temperatures includes a voltage divider formed by a thermister and resistor. As the temperature varies, the resistance of the thermister changes which changes the voltage output from the voltage divider. Changes in the voltage divider output can be calibrated into temperature changes. Thermocouples and other temperature measuring circuits may also be used.

Figure 19:
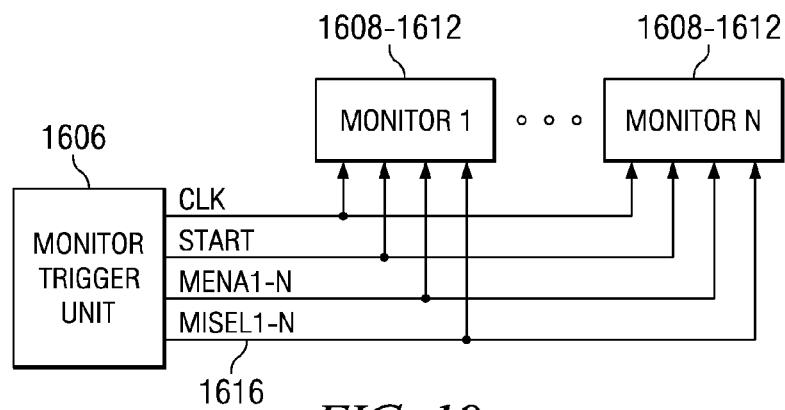
FIG. 19 illustrates the monitor trigger unit's plug-n-play control bus to a number of monitors in an interposer.

FIG. 19 illustrates monitor control bus 1616 of the monitor trigger unit 1606 connected to an N number of monitors 1608-1612. The monitor control bus consists of a clock (CLK) signal, a Start signal, monitor enable signals (MENA1-N) and monitor input select (MISEL1-N) signals. The CLK signal is common to all monitors 1–N and times the operation of the monitors 1–N. The Start signal is common to all monitors 1–N and starts the operation of one or more of the monitors 1–N. The MENA1-N signals enable the operation of one or more of the monitors 1–N. Typically, but not necessarily, there will be one MENA signal for each monitor. The MISEL1-N signals control the selection of inputs on one of more monitors that have selectable inputs.

"Plug and Play" Monitor Control Bus

The monitor control bus 1616 is "plug and play" in nature in that it can be interfaced to any number and/or type of monitors that have inputs adapted for receiving and operating in response to the CLK, Start, MENA1-N and MISEL1-M signals provided by monitor trigger unit 1606 on monitor control bus 1616. All that is required to extend the number of monitors on the monitor control bus 1616 is to provide a MENA signal for each monitor and MISEL signals, if necessary, to each monitor coupled to the monitor control bus 1616.

Figure 20A:
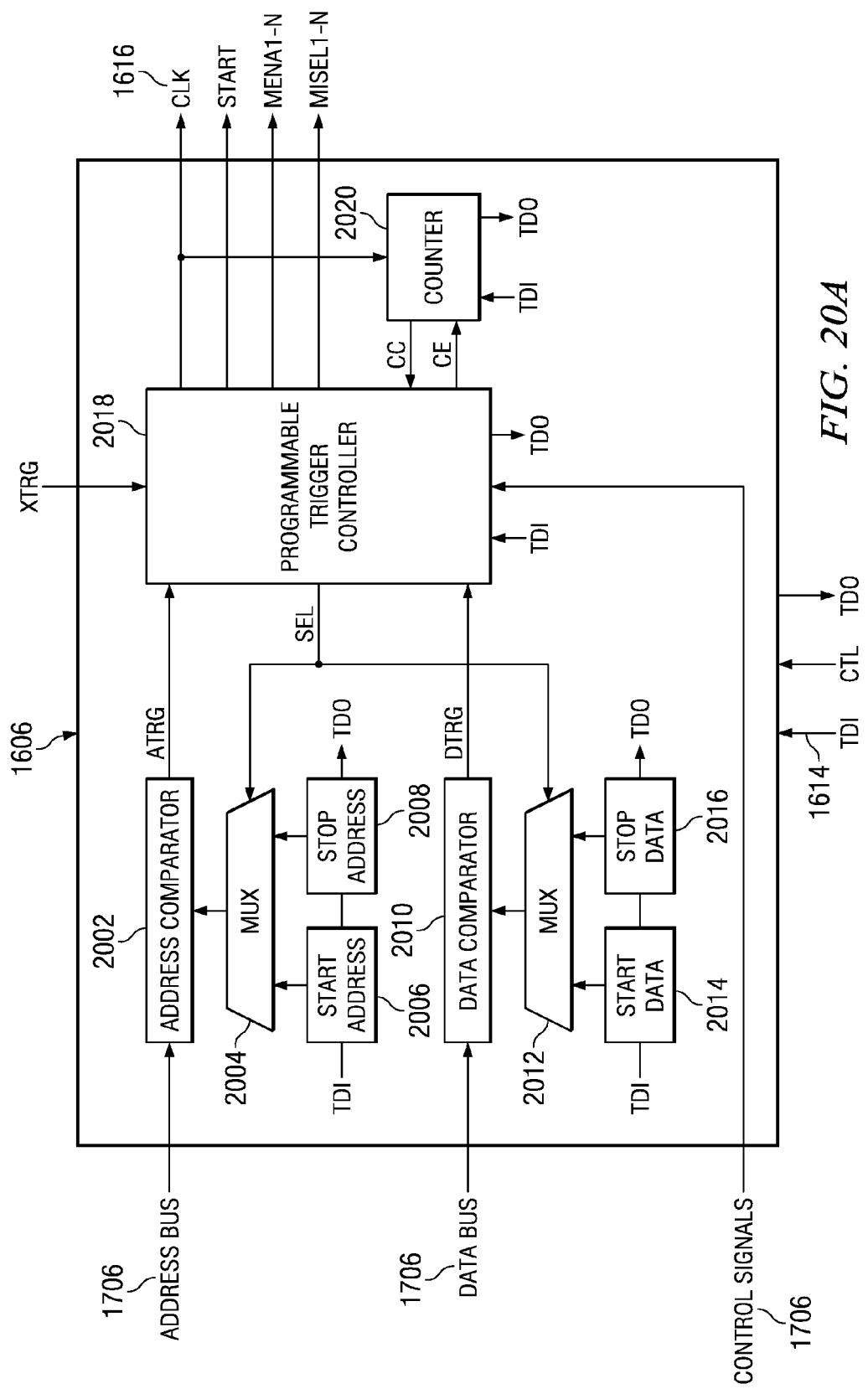
FIG. 20A illustrates a first example implementation of the monitor trigger unit.

FIG. 20A illustrates an example implementation of Trigger Unit 1606. The Trigger Unit includes an address bus comparator 2002, an address multiplexer 2004, a start address storage register 2006, a stop address storage register 2008, a data bus comparator 2010, a data multiplexer 2012, a start data storage register 2014, a stop data storage register 2016, a programmable trigger controller 2018 and a counter 2020, all connected as shown.

The address bus comparator 2002 inputs an address bus from FIO connections 1706 and compares the address to an address stored in the start 2006 or stop 2008 address registers. The address bus comparator outputs an address trigger (ATRG) to the programmable trigger controller if a match occurs between the address bus and start or stop stored addresses. Addresses are stored in the start and stop address registers by a TDI to TDO shift operation performed by the interposer's TAP 204 via interface 1604. Multiplexer 2004 is controlled by a select (SEL) signal from the programmable trigger controller to determine whether the address bus is compared to the stored start or stop address.

The data bus comparator 2010 inputs a data bus from FIO connections 1706 and compares the data to a data stored in the start 2014 or stop 2016 data registers. The data bus comparator outputs a data trigger (DTRG) to the programmable trigger controller if a match occurs between the data bus and start or stop stored data. Data are stored in the start and stop data registers by a TDI to TDO shift operation performed by the interposer's TAP 204 via interface 1604. Multiplexer 2012 is controlled by the SEL signal from the programmable trigger controller to determine whether the data bus is compared to the stored start or stop data.

The programmable trigger controller 2018 inputs the ATRG signal from comparator 2002, DTRG signal from comparator 2010, the optional XTRG signal, a count complete (CC) signal from counter 2020 and functional control signals from FIO connections 1706. The programmable trigger controller outputs the CLK signal, the Start signal, the MENA1-N signals and the MISEL1-N of control bus 1616 and a counter enable (CE) signal to counter 2020. The programmable trigger controller is programmed by a TDI to TDO shift operation performed by the interposer's TAP 204 via interface 1604.

The counter 2020 inputs the CE and CLK signals from the programmable trigger controller and outputs the CC signal to the programmable trigger controller. When enabled by CE, the counter operates for a count in response to the CLK signal. The count is loaded into the counter by a TDI to TDO shift operation performed by the interposer's TAP 204 via interface 1604. When the count expires the counter outputs the CC signal to the programmable trigger controller.

The TDI and TDO signals of the start and stop address registers 2006-2008, the start and stop data registers 2014-2016, the programmable trigger controller 2018 and the counter 2020 may be separately coupled to the TDI and TDO signals of the interposers TAP 204 interface 1604 so that each may be accessed individually. Alternatively, the TDI and TDO signals of the start and stop address registers 2006-2008, the start and stop data registers 2014-2016, the programmable trigger controller 2018 and the counter 2020 may be daisy-chained between the TDI and TDO signals of the interposers TAP 204 interface 1604 so that they all may be accessed together.

Figure 20B:
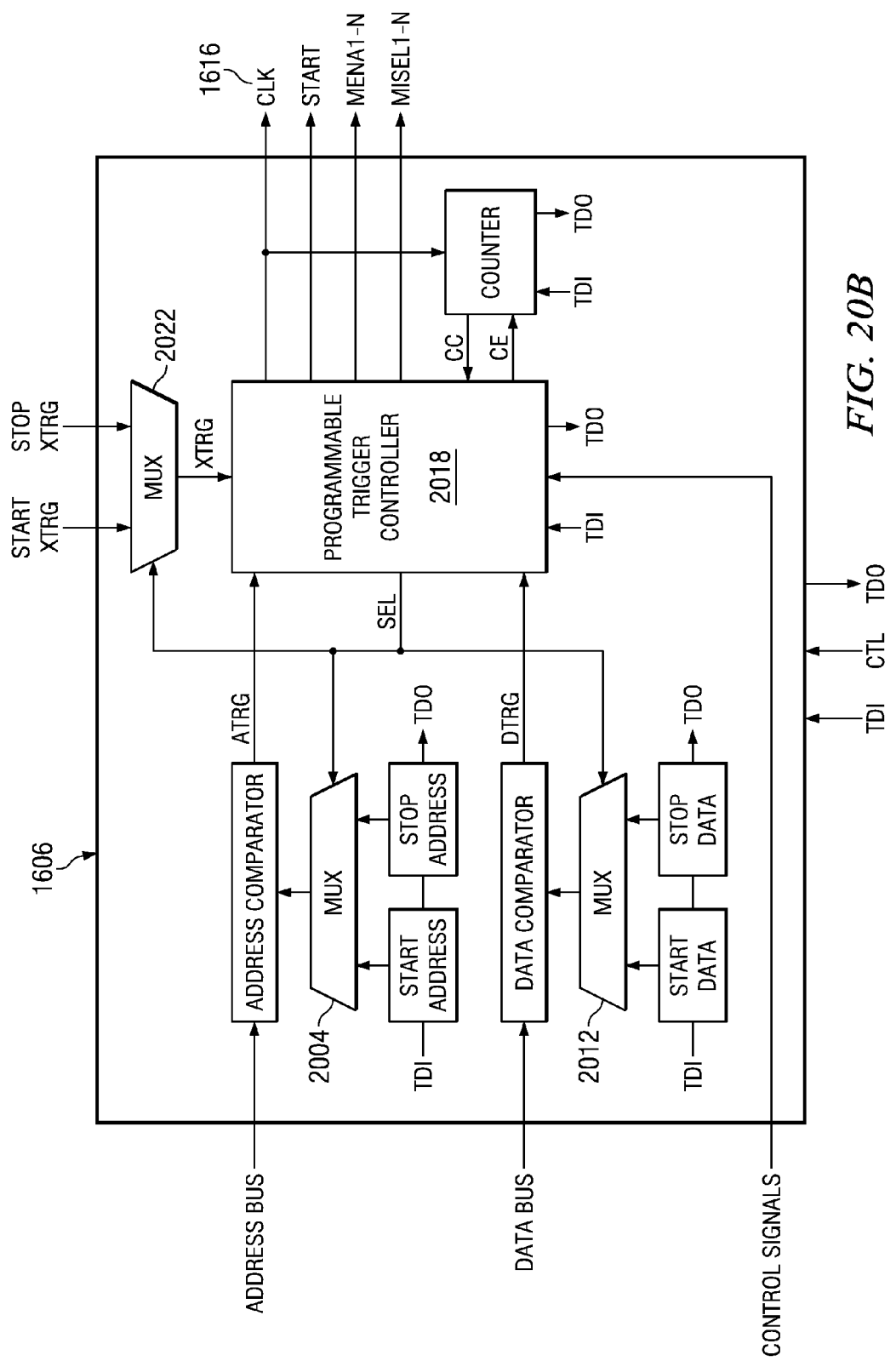
FIG. 20B illustrates a second example implementation of the monitor trigger unit.

FIG. 20B is provided to illustrate that the XTRG input to the programmable trigger controller may come from a multiplexer 2022 which inputs a Start XTRG and a Stop XTRG. The SEL output of the programmable trigger controller controls multiplexer 2022 to select between the Start XTRG and Stop XTRG inputs as it was described selecting the Start and Stop data and address inputs to multiplexers 2004 and 2012.

Figure 21:
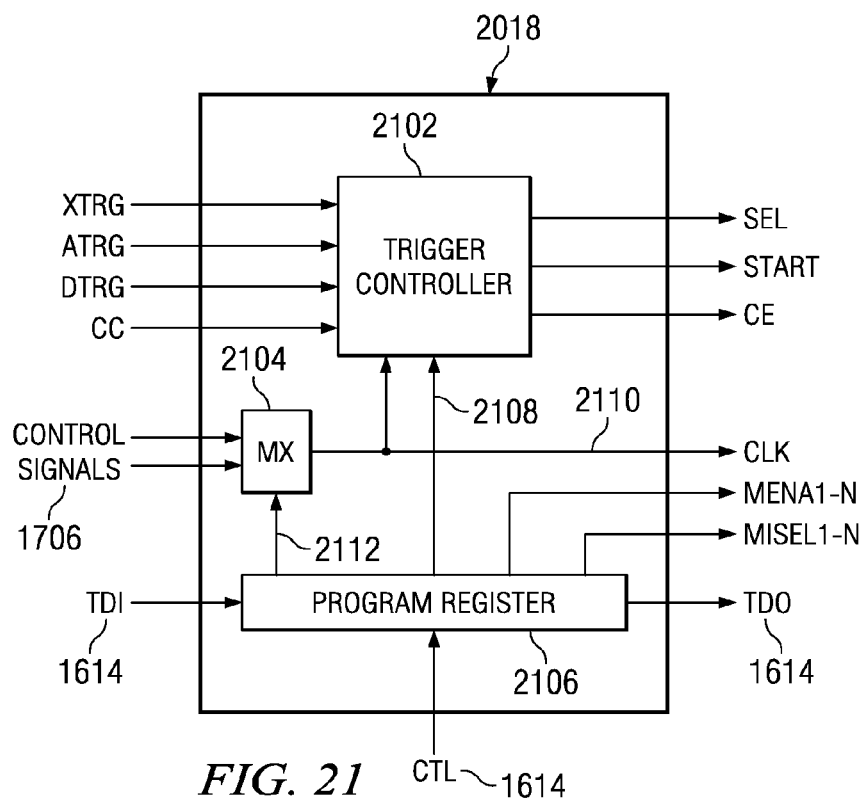
FIG. 21 illustrates an example implementation of the programmable trigger controller of the monitor trigger unit.

FIG. 21 illustrates an example implementation of programmable trigger controller 2018. The programmable trigger controller includes trigger controller 2102, a functional control signal multiplexer 2104 and a program register 2106 which is accessible by TAP interface 1614.

The trigger controller 2102 inputs the XTRG, ATRG, DTRG, and CC signals, the CLK signal output from multiplexer 2104 and programming data input 2108 from program register 2106. The trigger controller 2102 outputs the SEL and Start signals of bus 1616 and the CE signal to counter 2020. The multiplexer 2104 inputs functional control signals from FIO 1706 and signal selection control 2112 from program register 2106. The multiplexer 2104 selects a desired timing signal from the functional control inputs 1706 and outputs it as the CLK 2110 signal of bus 1616. The program register 2106 outputs selection control signals to multiplexer 2104, program data input to trigger controller 2102 and the MENA1-N and MISEL1-N signals of bus 1616. The program register is loaded by a TDI to TDO shift operation from TAP interface 1614.

Figure 22:
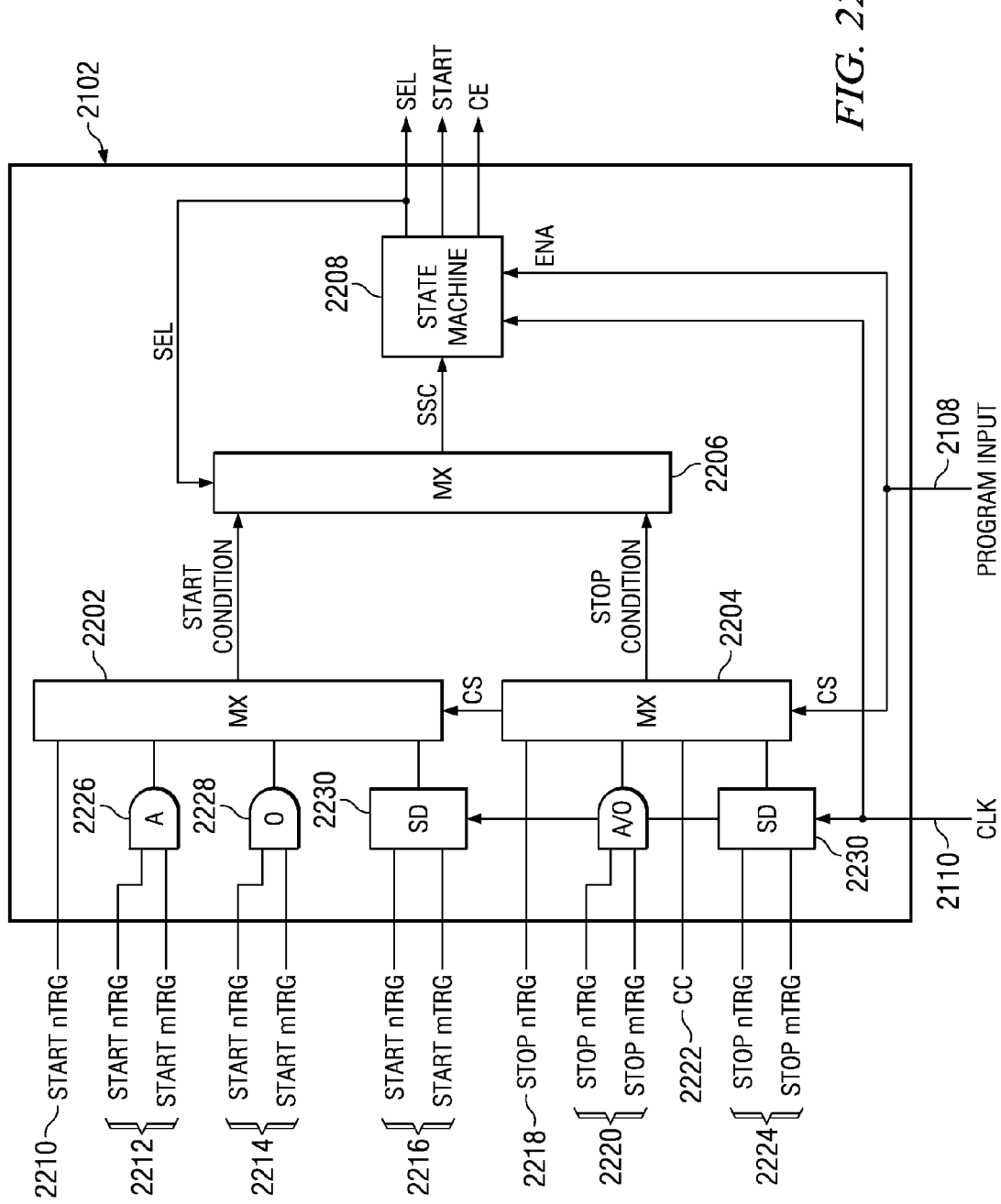
FIG. 22 illustrates an example implementation of the trigger controller of the programmable trigger controller.

FIG. 22 illustrates a detailed example implementation of trigger controller 2102 which includes a start condition multiplexer 2202, a stop condition multiplexer 2204, a start stop condition multiplexer 2206 and a state machine 2208.

Multiplexer 2202 has inputs for various example start conditions, including a selectable start nTRG 2210 where "n" can be a start XTRG, a selectable start ATRG or start DTRG, a selectable start nTRG "AND'ed" with a selectable start mTRG 2212 where "m" can be any start TRG other than the start nTRG, or any sequence of selectable start nTRG and start mTRG signals 2216 occurring separately in time. Multiplexer 2202 has condition select (CS) inputs coupled to program register 2106 via bus 2108 and a Start Condition output coupled to multiplexer 2206.

Multiplexer 2204 has inputs for various example stop conditions, including a selectable stop nTRG 2218, a selectable stop nTRG "AND'ed" or "OR'ed" with a selectable stop mTRG 2220, a count complete (CC) signal 2222 and a selectable stop nTRG and stop mTRG sequence 2224. Multiplexer 2204 has condition select (CS) inputs coupled to program register 2106 via bus 2108 and a Stop Condition output coupled to multiplexer 2206.

In this example, the TRG ANDing function is performed by AND gates 2226, the OR function is performed by OR gates 2228, and TRG sequences are detected by a sequence detector (SD) state machine 2230 timed by CLK signal 2010.

Multiplexer 2206 has inputs for the Start Condition signal from multiplexer 2202, the Stop Condition signal from multiplexer 2204, a Start/Stop selection (SEL) signal from state machine 2208 and a start stop condition (SSC) output.

State machine 2208 has an input coupled to the SSC output of multiplexer 2206, a clock input coupled to the CLK signal 2010, an enable (ENA) input coupled to program register 2104 via bus 2108 and outputs for the SEL, Start and CE signals.

Figure 23:
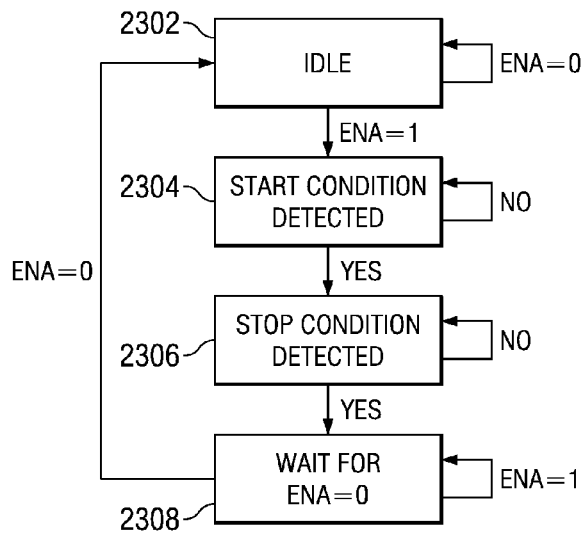
FIG. 23 illustrates the operation diagram of the state machine in the trigger controller.

FIG. 23 illustrates an example operation diagram of state machine 2208. When the ENA signal is not asserted, the state machine will be disabled in an Idle state 2302. In state 2302, the SEL signal is set for selecting the Start Condition. When the ENA signal is asserted, the state machine transitions to state 2304 where it polls for a Start Condition from multiplexer 2206. When a Start Condition occurs, the state machine transitions to state 2306 where it; (1) sets the Start signal of bus 1616, (2) sets the SEL signal for selecting the Stop Condition, (3) sets the CE signal to enable counter 2020 and polls for a Stop Condition from multiplexer 2206. When a Stop Condition occurs, the state machine transitions to state 2308 where it; (1) resets the Start signal of bus 1616, (2) sets the CE signal to disable the counter 2020, (3) sets the SEL signal for selecting the Start Condition and (4) waits for the ENA signal to be de-asserted. When ENA is de-asserted the state machine transitions to Idle state 2302.

The CE signal is set in state 2306 to allow the counter's CC signal to be selected for providing the Stop Condition. For example, a monitoring operation may be started by any of the selectable Start Conditions input to multiplexer 2202, then, after a predetermined count, the monitoring operation may be terminated by the CC output of counter 2020. It should be understood that a further refinement of the operation diagram of 22 may include optionally enabling the CE signal based upon whether the counter 2020 is selected for providing the Stop Signal. This would eliminate the counter from consuming power when it is not used to provide the Stop Condition.

As seen in FIGS. 20A-20B, setting the SEL signal for a Start Condition in state 2302 includes setting multiplexers 2004, 2012 and if present multiplexer 2022 to select the start data and start address patterns to be input to comparators 2002 and 2010 and the start XTRG to be input to the programmable trigger controller 2018. Also as seen in FIGS. 20A-20B, setting the SEL signal for a Stop Condition in state 2306 includes setting multiplexers 2004, 2012 and if present multiplexer 2022 to select the stop data and stop address patterns to be input to comparators 2002 and 2010 and the stop XTRG to be input to the programmable trigger controller 2018.

Figure 24:
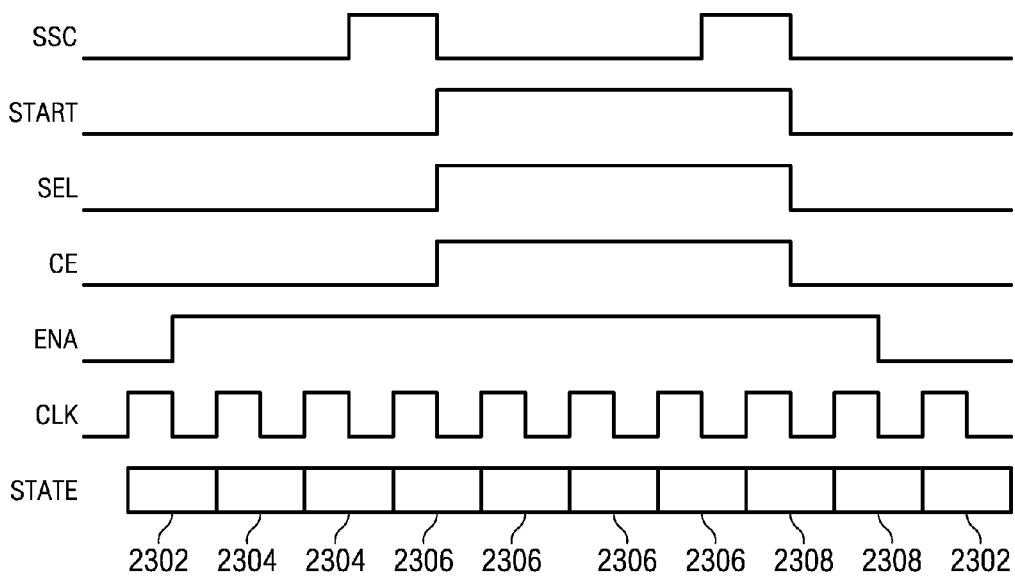
FIG. 24 illustrates an example timing diagram of the state machine in the trigger controller.

FIG. 24 illustrates one example timing diagram depicting the operation of state machine 2208. Initially the state machine is in state 2302 waiting for the ENA signal to be asserted. When the ENA signal is asserted the state machine transitions to state 2304 to poll for a Start Condition on the SSC output of multiplexer 2206. When a Start Condition is detected the state machine transitions to state 2306 to poll for a Stop Condition on the SSC output of multiplexer 2206. In state 2306 the Start, SEL and CE signals are asserted. The asserted Start signal enables a selected one or more monitors to begin a monitoring operation timed by CLK 2110. The asserted CE signal enables the counter 2020 to begin counting operation timed by the CLK 2110. The asserted SEL signal controls multiplexer 2206 to output a stop condition to the state machine. The SEL signal also controls multiplexers 2004, 2012 and 2022 to select the stop data, address or XTRG conditions. When a Stop Condition is detected the state machine transitions to state 2308 to wait for the ENA signal to be de-asserted. In state 2308 the Start, SEL and CE signals are de-asserted. When the ENA signal is de-asserted the state machine transitions back to the Idle state 2302.

FIG. 25 illustrates an example monitor architecture 2502 that could be used by the disclosure. The architecture includes a parallel register 2504, an auto-incrementing monitor memory 2506, a serial/parallel register 2508 and a monitor controller 2510 all connected as shown.

Register 2504 has a parallel input bus 2512, a parallel output bus 2514 and a clock (CLK) input 2516.

Register 2508 has a serial bus connected to the TDI, CTL and TDO signals of the interposer TAP interface 1614, a parallel input bus 2518 and a parallel output bus 2520.

Controller 2510 has inputs connected to the Start, CLK and a monitor enable (ME) signals of bus 1616 of programmable trigger controller 2018. Controller 2510 has an increment 1 (INC1) output, a write (WR) output and a reset 1 (RST1) output.

Figure 4:
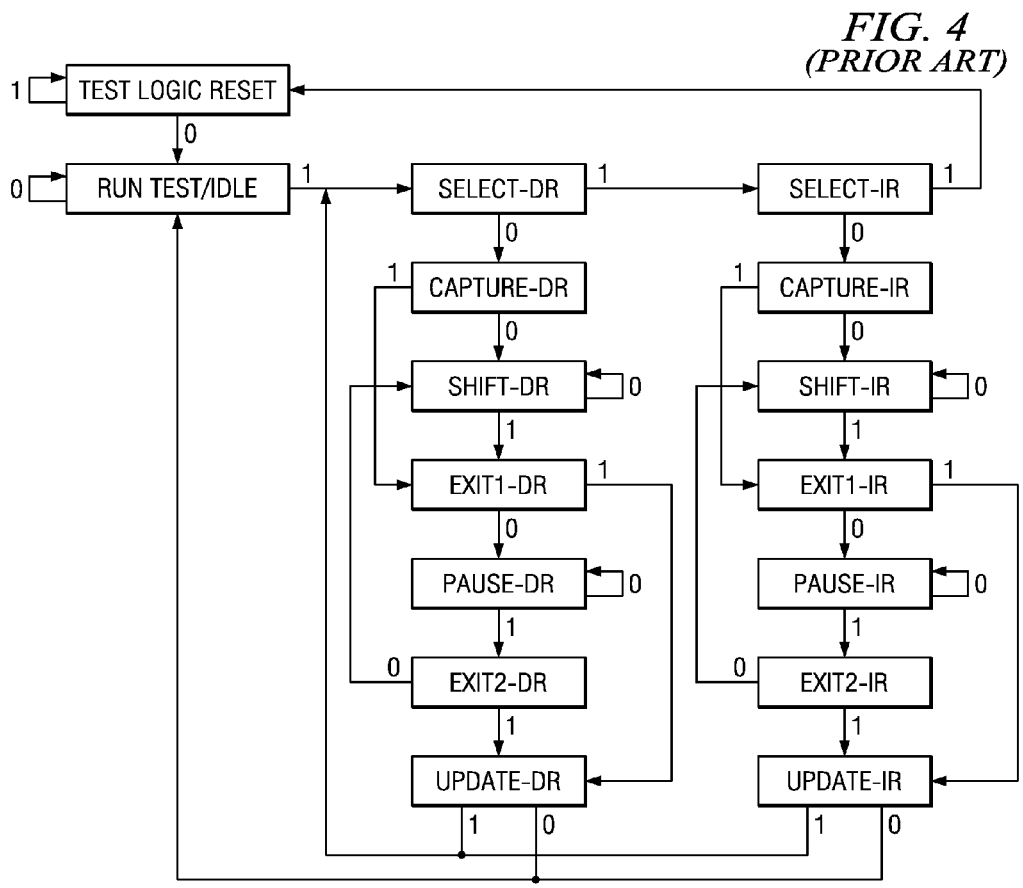
FIG. 4 illustrates the operational state diagram of the TAP.

Memory 2506 has a parallel data input (DI) bus coupled to the parallel data output bus 2514 of register 2504, a parallel data output (DO) bus coupled to the parallel data input bus 2518 of register 2508. Memory 2506 has a first memory address increment input coupled to the INC1 output of controller 2510, a memory write input coupled to the WR output of controller 2510, a first address reset input coupled to the RST1 output of controller 2510. Memory 2506 has a memory read (RD) input coupled to an output of bus 2520 and a second address reset input (RST2) coupled to an output of bus 2520. Memory 2506 has a second memory address increment input (INC2) coupled to an output from the CTL bus of interposer TAP bus 1614. In this example, and when register 2508 is selected for access by a TAP instruction that is used to read the contents of memory 2506, the INC2 signal is asserted each time the TAP passes through the Exist1-DR state of FIG. 4. While in this example the Exit1-DR state is used to provide the INC2 signal, it should be understood that other appropriate TAP states could be used to provide the INC2 signal during memory read operations.

At the beginning of a memory read operation, register 2508 is accessed by the TAP interface 1614 to toggle the RST2 signal of bus 2520 and to set the RD signal of bus 2520 to place the memory in read mode. Toggling the RST2 signal resets the memory address to a starting point from which the read operation will begin, typically address zero. After this initial setup procedure, register 2508 is accessed by the TAP to capture the monitor data stored at the starting point address during the Capture-DR state of Figured 4 and to shift the captured data out during the Shift-DR state of FIG. 4. The TAP then transitions through the Exit1-DR state of FIG. 4 to activate the INC2 signal to increment the memory's address. The TAP then transitions to Capture-DR state, via the Update-DR and Select-DR states, to capture and shift out the data stored in the next memory address location. This capture, shift and increment address process repeats until all the contents of the memory have been read. During these TAP controlled memory read operations, the RD signal of bus 2520 is set to keep the memory in read mode. At the end of the read operation, the TAP resets the RD signal.

FIG. 26 illustrate an example implementation of an auto-addressing monitor memory 2506 that could be used in this disclosure. The auto-addressing monitor memory consists of monitor memory 2602, an address counter 2604, And gate 2606 and Or gate 2608. The memory 2602 has a data input (DI) for inputting parallel data 2514 from register 2504, the WR input from controller 2510, the RD input from register 2508 and address input from address counter 2604. The memory has a data output (DO) for outputting data to the parallel input 2518 of register 2508. The address counter has a RST input from And gate 2606, a CLK input from Or gate 2608 and an address bus output to memory 2602. And gate 2606 has an input for the RST1 signal from controller 2510, an input for the RST2 signal from register 2508 and an output to provide the counter RST signal. Or gate 2606 has an input for the INC1 signal from the controller 2510, and input for the INC2 signal from the TAP CTL bus and an output to provide the counter CLK signal.

During monitor store operations, controller 2510 is enabled to provide the RST1, INC1 and WR signals to auto-addressing monitor memory 2502. During monitor read operations, the interposer's TAP accesses register 2518 to provide the RST2, INC2 and RD signals to auto-addressing monitor memory 2502 to read out its stored contents.

FIG. 27 illustrates an example implementation of monitor controller 2510 which consists of a state machine. The state machine has inputs for inputting the Start, CLK and MENA signals 1616 from monitor trigger unit 1606 and outputs for outputting the RST1, WR and INC1 signals to auto-addressing monitor memory 2506 and the CLK signal 2516 to register 2504.

Figure 28:
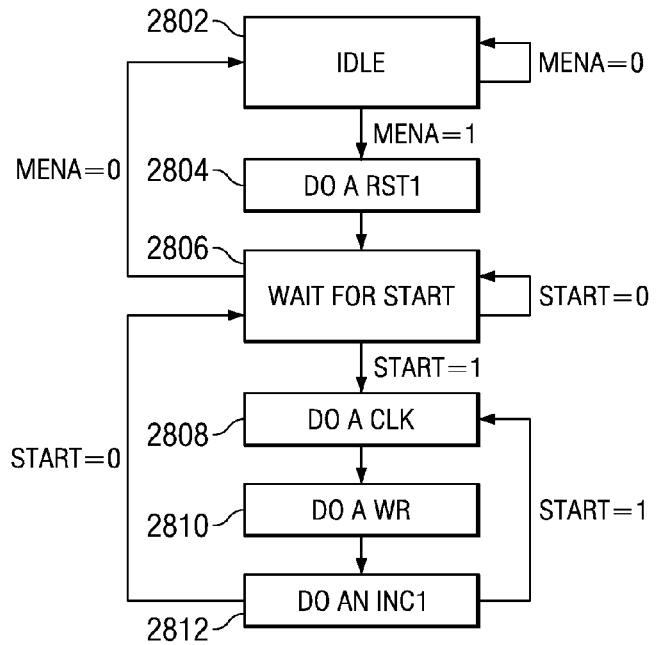
FIG. 28 illustrates the operational diagram of the monitor controller state machine.

FIG. 28 illustrates an example operational diagram of state machine 2510. Initially the state machine will be in an Idle state 2803 waiting for the MENA signal to be asserted. When MENA is asserted the state machine transitions to state 2804 to output a RST1 to reset address counter 2604 to the starting address. From state 2804 the state machine transitions to state 2806 where it polls for a Start signal. When the Start signal occurs, the state machine transitions to state 2808 where it outputs a CLK signal 2516 to register 2504. In response to the CLK signal, register 2504 stores the data present at its input 2512. From state 2808 the state machine transitions to state 2810 where it outputs a WR signal to auto-addressing monitor memory 2506. In response to the WR signal, auto-addressing monitor memory 2506 stores the data that was stored in register 2504 in response to the CLK signal of state 2808. From state 2810 the state machine transitions to state 2812 where it outputs an INC1 signal to address counter 2604 to select the next memory location to be written too. If the Start signal is still asserted, the state machine transitions back to state 2808 to repeat the CLK, WR and INC1 state operations. If the Start signal is de-asserted, the state machine transitions to state 2806 to wait for either another Start signal or the MENA signal to be de-asserted.

Figure 29:
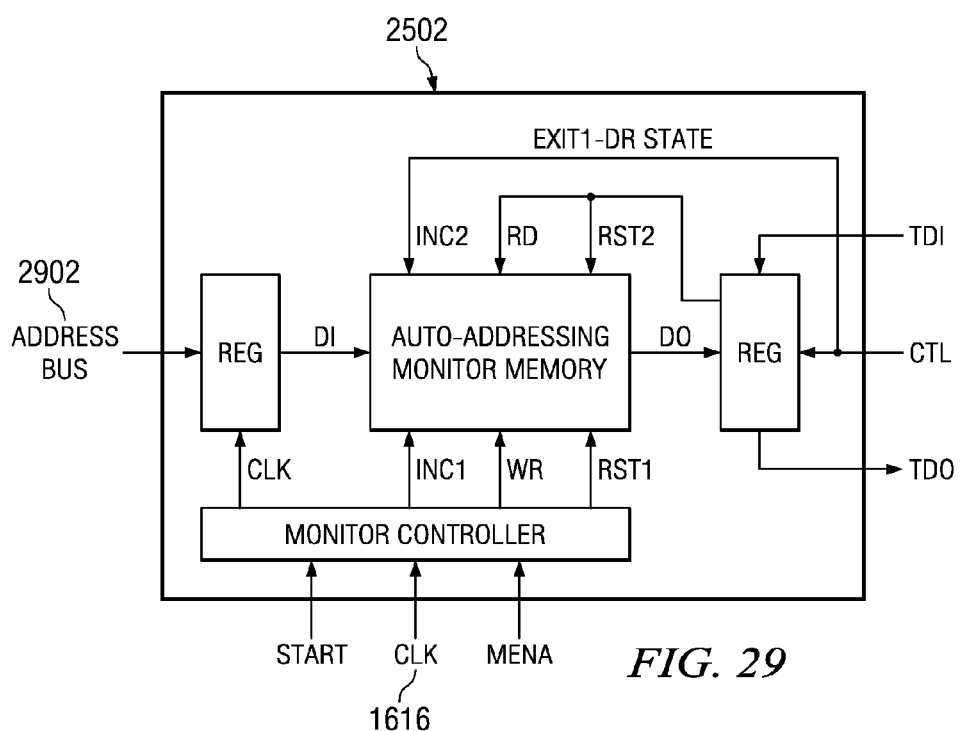
FIG. 29 illustrates a monitor for monitoring an address bus.

FIG. 29 illustrates a monitor 2502 wherein in the purpose is to monitor the activity of an address bus 2902 within an interposer 1410.

Figure 30:
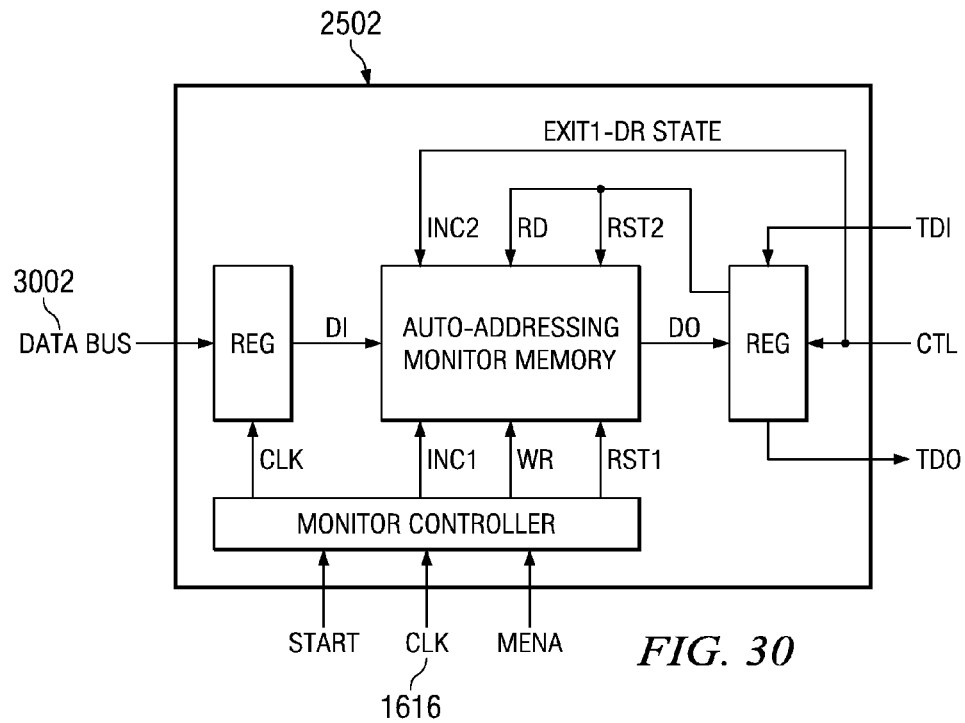
FIG. 30 illustrates a monitor for monitoring a data bus.

FIG. 30 illustrates a monitor 2502 wherein in the purpose is to monitor the activity of a data bus 3002 within an interposer 1410.

Figure 31:
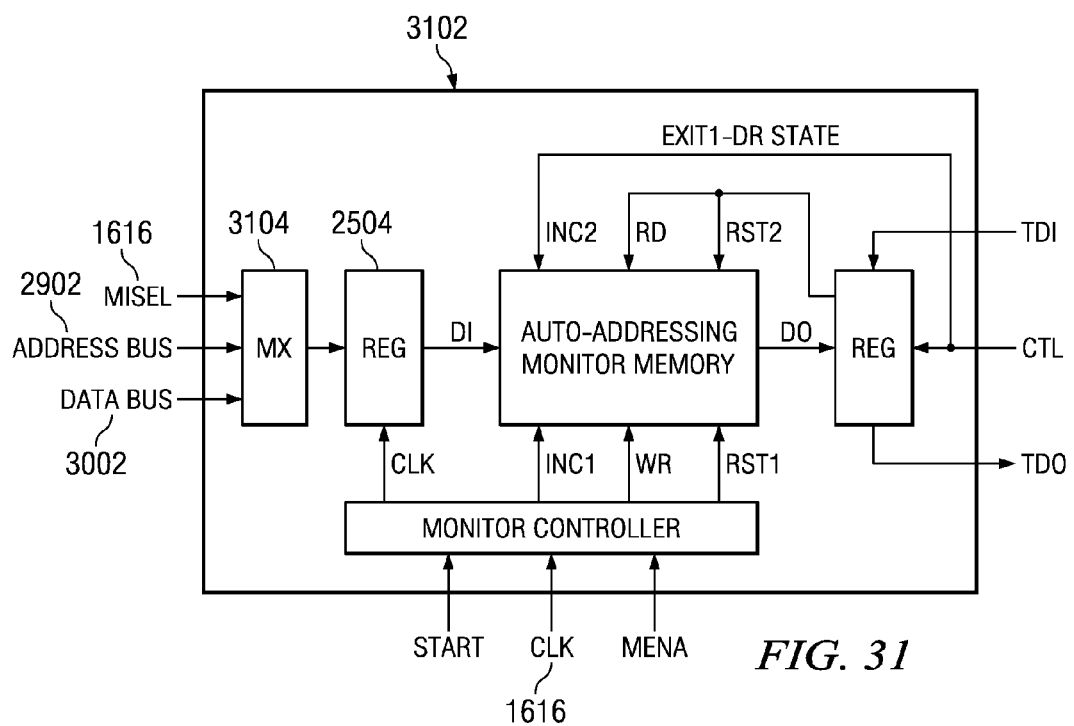
FIG. 31 illustrates a monitor for monitoring either an address bus or data bus.

FIG. 31 illustrates a monitor 3102 wherein in the purpose is to monitor the activity of either an address bus 2902 or a data bus 3002 within an interposer 1410. Monitor 3102 differs from monitor 2502 in that it includes a multiplexer 3104 to select the input to register to selectively come from an address bus 2902 or a data bus 3002. A MISEL signal from monitor trigger unit 1606 bus 1616 determines whether the address bus or data bus is selected for monitoring.

Figure 32:
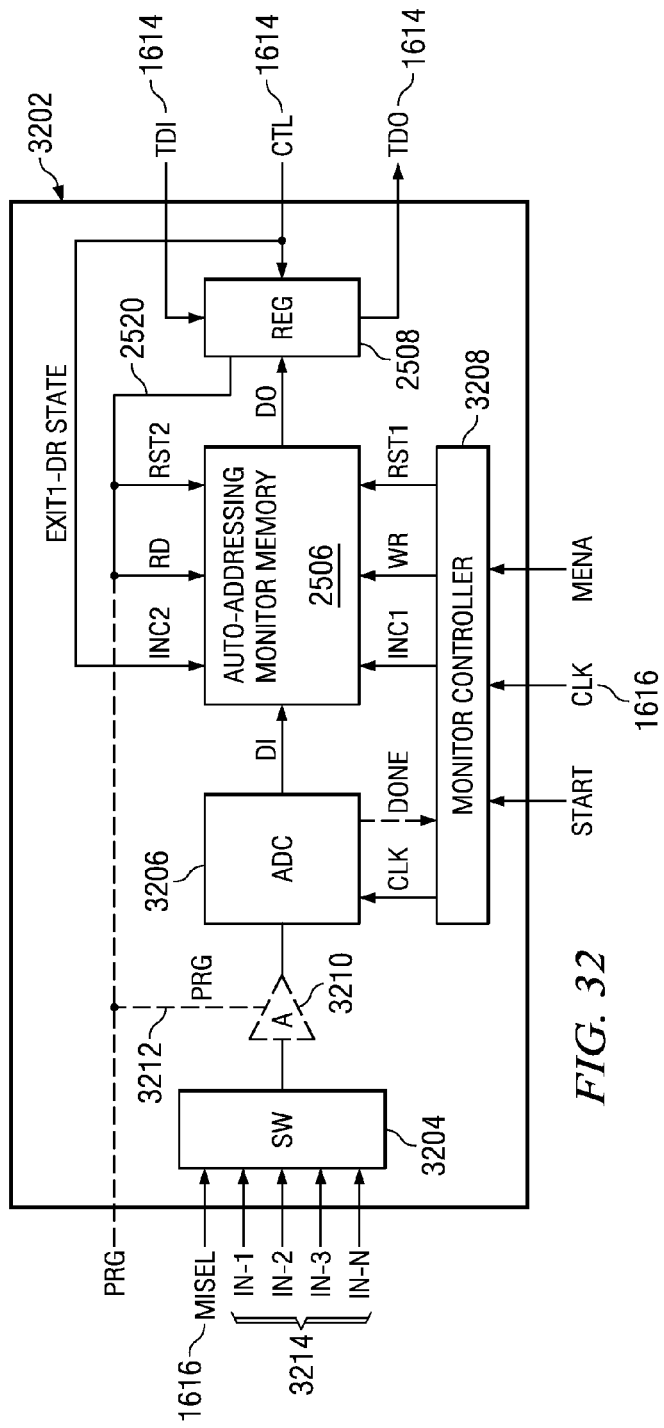
FIG. 32 illustrates a monitor for monitoring single ended analog signals.

FIG. 32 illustrates a monitor 3202 wherein in the purpose is to monitor the activity of an analog signal within an interposer 1410. The analog signal may be any type of signal such as a time varying voltage signal, such as but not limited to, a sine wave or a fixed voltage signal such as, but not limited to, a power supply voltage. Monitor 3202 differs from monitor 2502 in that it includes an analog switch (SW) 3204, an analog to digital converter (ADC) 3206 and a monitor controller 3208 adapted for controlling the ADC 3206 as described below in regard to FIGS. 33-36. Any type of ADC can be used that has an analog input and parallel digital outputs, including, but not limited to, successive approximation ADCs and Flash ADCs. The output of the analog switch 3204 may be directly coupled to the analog input of the ADC or an amplifier (A) 3210 may exist between the analog switch output and ADC input. If the amplifier in programmable, for example a programmable gain amplifier, it can receive programming (PRG) input 3212 by extending the length of register 2508 to provide the PRG input to the amplifier via bus 2520. The programming (PRG) input may alternately come from a source, for example a TAP register, external of monitor 3202. The analog switch receives MISEL input from bus 1616 of monitor trigger unit 1606 to select one of the switch inputs (IN1-N) 3214 to be output from the switch. The parallel digital outputs of the ADC are input to parallel inputs of monitor memory 2506.

Figure 33:
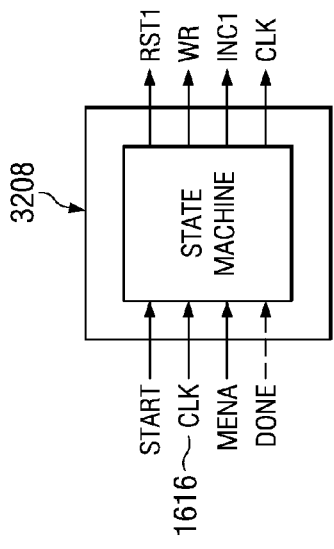
FIG. 33 illustrates the monitor controller state machine of the analog signal monitor of FIG. 32.

FIG. 33 illustrates an example monitor controller 3208 which includes a state machine. The state machine differs from state machine 2510 of FIG. 27 in that it includes an optional Done input from ADC 3206. Also, depending upon the type of ADC used, the operation of the CLK output to the ADC may be different from the operation of the state machine described in FIGS. 27 and 28.

Figure 34:
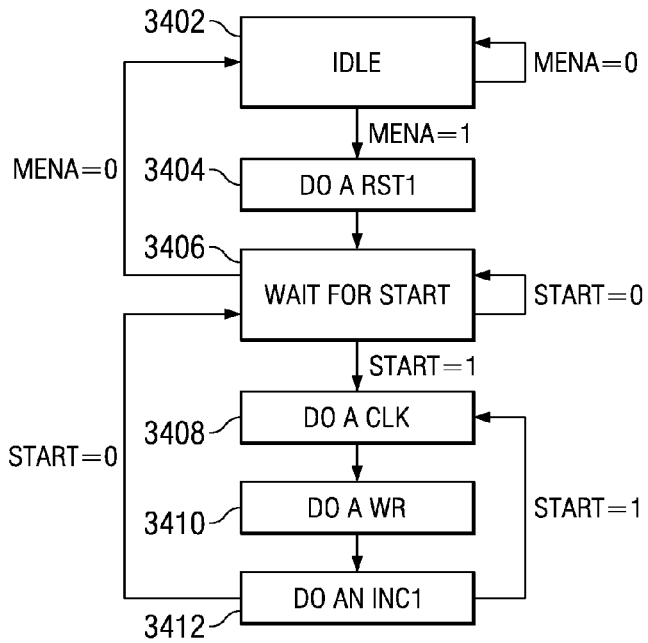
FIG. 34 illustrates a first operational diagram of the analog signal monitor controller state machine.

FIG. 34 illustrates a first example operational diagram of state machine 3208. Initially the state machine will be in an Idle state 3402 waiting for the MENA signal to be asserted. When MENA is asserted the state machine transitions to state 3404 to output a RST1 to reset address counter 2604 to the starting address. From state 3404 the state machine transitions to state 3406 where it polls for a Start signal. When the Start signal occurs, the state machine transitions to state 3408 where it outputs a CLK signal to ADC 3206. In response to the CLK signal, ADC 3206 samples its analog input, digitizes the sampled signal and outputs a parallel digital representation of the analog signal to the parallel inputs of memory 2506. The ADC in this example is assumed to have a high speed internal clock that is enabled by the CLK signal to convert the sampled analog input into the parallel digital output. The analog to digital conversion is fast enough to occur before the WR signal is asserted in state 3410. From state 3408 the state machine transitions to state 3410 where it outputs a WR signal to auto-addressing monitor memory 2506. In response to the WR signal, auto-addressing monitor memory stores the parallel outputs of ADC 3206. From state 3410 the state machine transitions to state 3412 where it outputs an INC1 signal to address counter 2604 to select the next memory location to be written too. If the Start signal is still asserted, the state machine transitions back to state 3408 to repeat the CLK, WR and INC1 state operations. If the Start signal is de-asserted, the state machine transitions to state 3406 to wait for either another Start signal or the MENA signal to be de-asserted.

Figure 35:
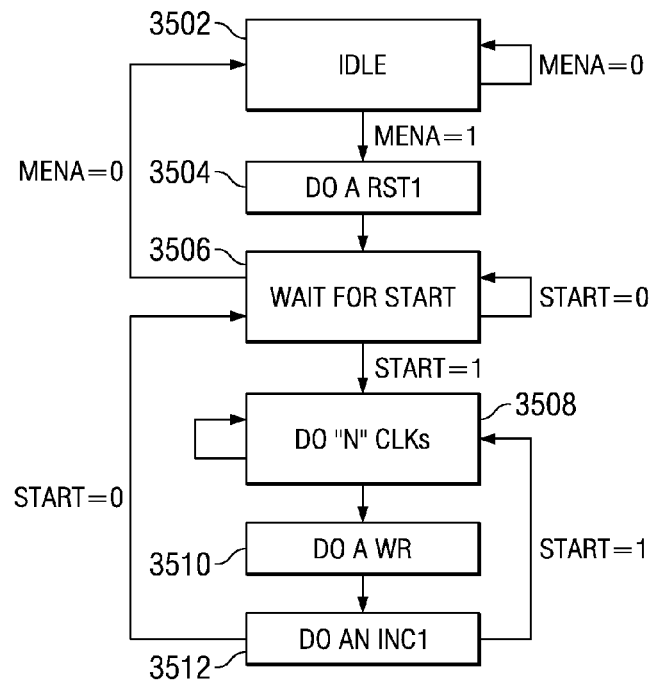
FIG. 35 illustrates a second operational diagram of the analog signal monitor controller state machine.

FIG. 35 illustrates a second example operational diagram of state machine 3208. Initially the state machine will be in an Idle state 3502 waiting for the MENA signal to be asserted. When MENA is asserted the state machine transitions to state 3504 to output a RST1 to reset address counter 2604 to the starting address. From state 3504 the state machine transitions to state 3506 where it polls for a Start signal. When the Start signal occurs, the state machine transitions to state 3508 where it outputs a number (N) of CLK signals to ADC 3206. In response to the CLK signals, ADC 3206 samples its analog input, digitizes the sampled signal and outputs a parallel digital representation of the analog signal to the parallel inputs of memory 2506. The ADC in this example is assumed to operate in response to the N CLK signals of state 3508 to convert the sampled analog input into the parallel digital output. From state 3508 the state machine transitions to state 3510 where it outputs a WR signal to auto-addressing monitor memory 2506. In response to the WR signal, auto-addressing monitor memory stores the parallel outputs of ADC 3206. From state 3510 the state machine transitions to state 3512 where it outputs an INC1 signal to address counter 2604 to select the next memory location to be written too. If the Start signal is still asserted, the state machine transitions back to state 3508 to repeat the CLK, WR and INC1 state operations. If the Start signal is de-asserted, the state machine transitions to state 3506 to wait for either another Start signal or the MENA signal to be de-asserted.

Figure 36:
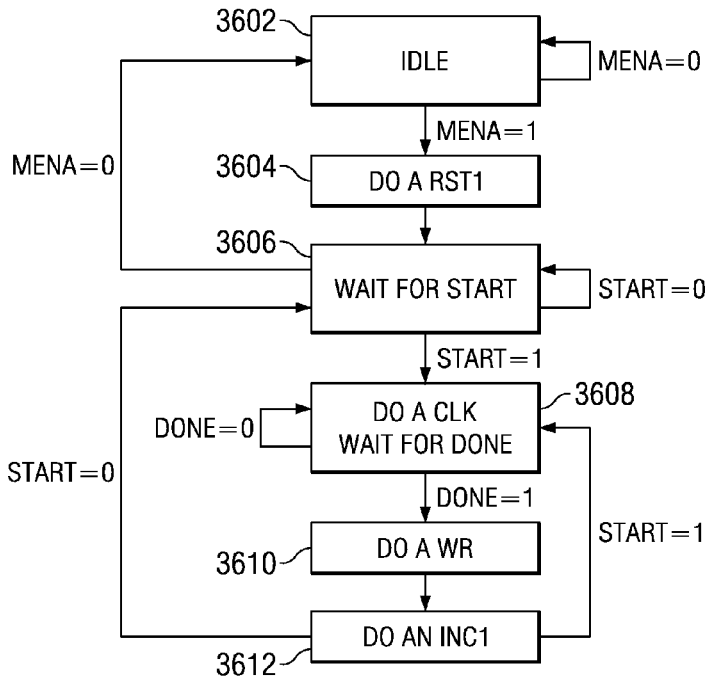
FIG. 36 illustrates a third operational diagram of the analog signal monitor controller state machine.

FIG. 36 illustrates a third example operational diagram of state machine 3208. Initially the state machine will be in an Idle state 3602 waiting for the MENA signal to be asserted. When MENA is asserted the state machine transitions to state 3604 to output a RST1 to reset address counter 2604 to the starting address. From state 3604 the state machine transitions to state 3606 where it polls for a Start signal. When the Start signal occurs, the state machine transitions to state 3608 where it outputs a CLK signal to ADC 3206 and polls for a Done signal from the ADC 3206. In response to the CLK signal, ADC 3206 samples its analog input, digitizes the sampled signal, outputs a parallel digital representation of the analog signal to the parallel inputs of memory 2506 then outputs the Done signal to the state machine 3208. The ADC in this example is assumed to have an internal clock that is enabled by the CLK signal to convert the sampled analog input into the parallel digital output. The analog to digital conversion of this example is not fast enough to occur before the WR signal is asserted in state 3610, therefore the state machine must remain in state 3608 until the Done signal is asserted. In state 3610 the state machine outputs a WR signal to auto-addressing monitor memory 2506. In response to the WR signal, auto-addressing monitor memory stores the parallel outputs of ADC 3206. From state 3610 the state machine transitions to state 3612 where it outputs an INC1 signal to address counter 2604 to select the next memory location to be written too. If the Start signal is still asserted, the state machine transitions back to state 3608 to repeat the CLK, WR and INC1 state operations. If the Start signal is de-asserted, the state machine transitions to state 3606 to wait for either another Start signal or the MENA signal to be de-asserted.

Figure 37:
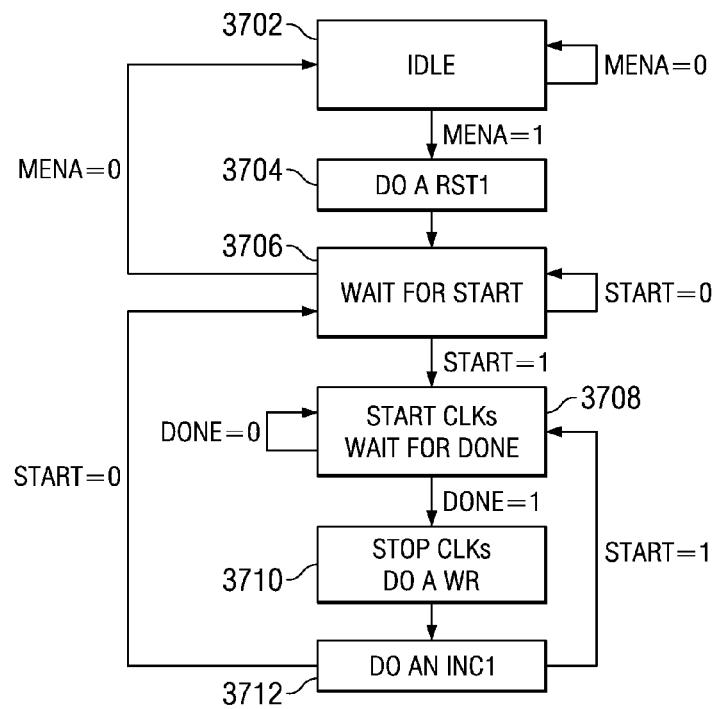
FIG. 37 illustrates a fourth operational diagram of the analog signal monitor controller state machine.

FIG. 37 illustrates a fourth example operational diagram of state machine 3208. Initially the state machine will be in an Idle state 3702 waiting for the MENA signal to be asserted. When MENA is asserted the state machine transitions to state 3704 to output a RST1 to reset address counter 2604 to the starting address. From state 3704 the state machine transitions to state 3706 where it polls for a Start signal. When the Start signal occurs, the state machine transitions to state 3708 where it outputs CLK signals to ADC 3206 and polls for a Done signal from the ADC 3206. In response to the CLK signals, ADC 3206 samples its analog input, digitizes the sampled signal, outputs a parallel digital representation of the analog signal to the parallel inputs of memory 2506 then outputs the Done signal to the state machine 3208. The ADC in this example is assumed to operate in response to the CLK signals output during state 3708 to convert the sampled analog input into the parallel digital output. When the analog to digital conversion is complete the Done signal is asserted and the state machine transitions to state 3710. In state 3710 the CLK outputs are stopped and a WR signal is output to memory 2506. In response to the WR signal, auto-addressing monitor memory stores the parallel outputs of ADC 3206. From state 3710 the state machine transitions to state 3712 where it outputs an INC1 signal to address counter 2604 to select the next memory location to be written too. If the Start signal is still asserted, the state machine transitions back to state 3708 to repeat the CLK, WR and INC1 state operations. If the Start signal is de-asserted, the state machine transitions to state 3706 to wait for either another Start signal or the MENA signal to be de-asserted.

Figure 38:
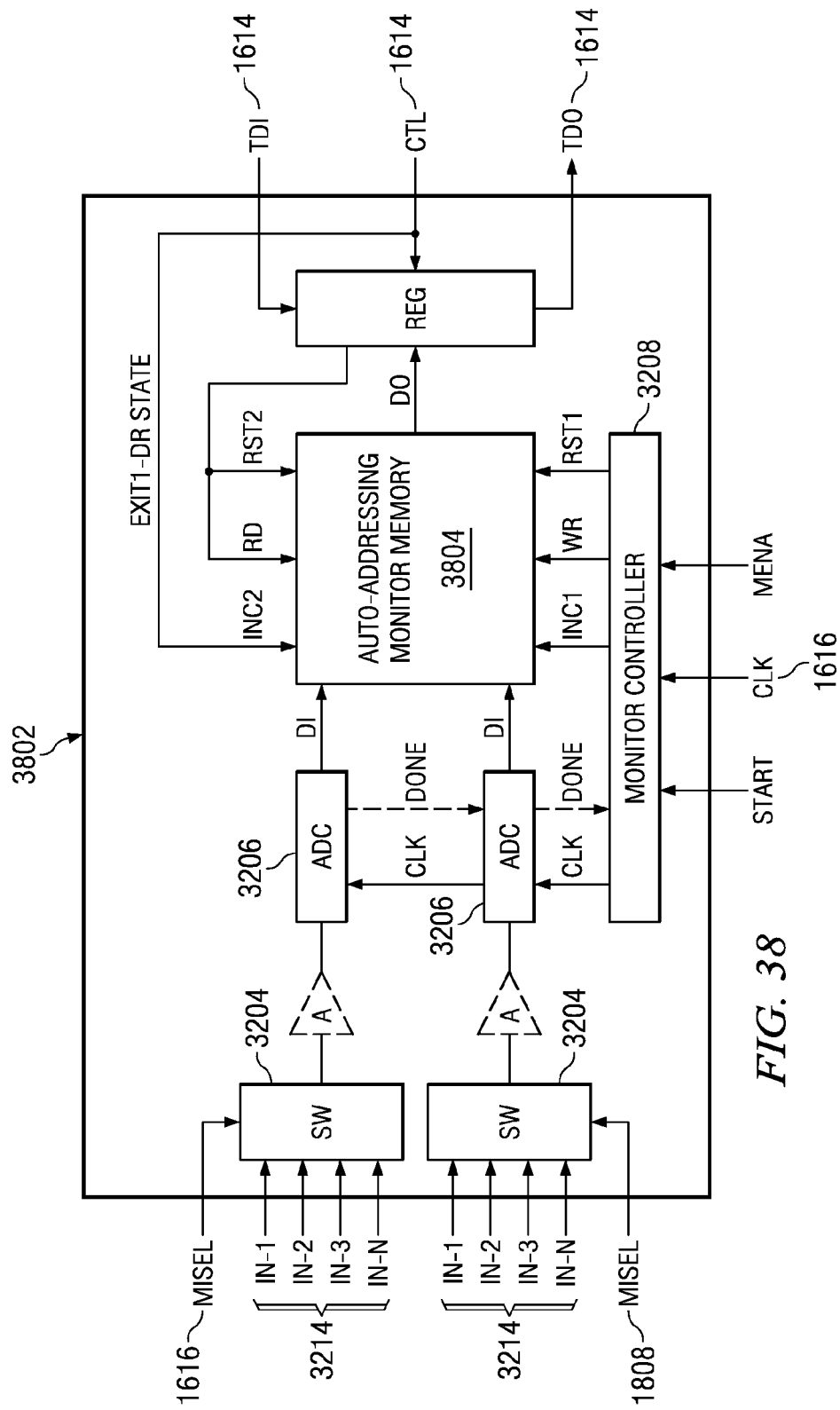
FIG. 38 illustrates a monitor for monitoring differential analog signals.

FIG. 38 illustrates a monitor 3802 wherein in the purpose is to simultaneously monitor the activity of a pair of analog signals within an interposer 1410. The analog signals may be any type of signals such as time varying voltage signals such as, but not limited to, sine wave signals or fixed voltage signals such as, but not limited to, power supply and/or ground voltages. Monitor 3802 differs from monitor 3202 in that it includes two analog switches (SW) 3204, two analog to digital converters (ADC) 3206 and a monitor memory 3804 having dual parallel input ports 3214, one for each parallel output of the ADCs. Any types of previously described ADCs may be used. The outputs of the analog switches 3204 may be directly coupled to the analog inputs of the ADCs or amplifiers may exist between the analog switch outputs and ADC inputs. If the amplifiers are programmable they can receive programming input as described in FIG. 32. The analog switches receive MISEL input from bus 1616 to select one of their switch inputs 3214 to be output to the ADCs. The parallel digital outputs of the ADCs are input to parallel inputs of the dual input ports of monitor memory 3804. The monitor controller 3208 can operate the ADCs as described in FIGS. 34-37. This type of analog monitor is used when it is desired to monitor differential analog voltages.

Figure 39:
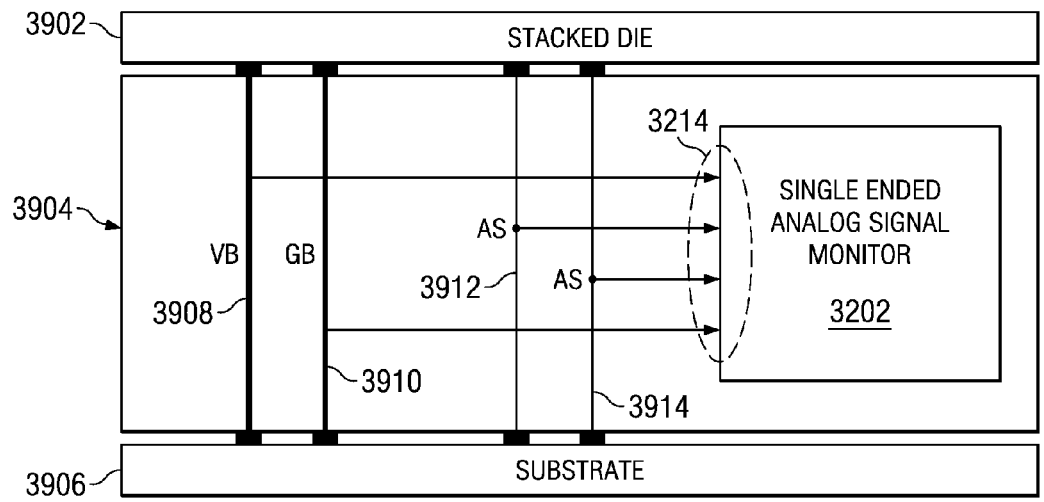
FIG. 39 illustrates a single ended analog signal monitor in an interposer.

FIG. 39 illustrates a stacked die 3902 mounted on an interposer 3904 which is mounted on a substrate 3906. The interposer provides a voltage bus (VB) 3908, ground bus (GB) 3910 and functional interconnects, including analog signal (AS) interconnects 3912 and 3914 between the stacked die and substrate. The interposer includes the single ended analog signal monitor 3202 of FIG. 32. The inputs 3214 of analog monitor 3202 are connected to the VB 3908, GB 3910, AS 3912 and AS 3914. When enabled by monitor trigger unit 1606, monitor 3202 operates to sample, digitize and store the voltage levels occurring in time on a selected input, i.e. VB, GB or AS. When the monitoring operation ends, the stored digital representations of the sampled voltages can be shifted out of the monitor memory for examination, via the interposer TAP 204.

The single ended analog signal monitoring of FIG. 39 can be triggered to start and stop during selected functional start and stop conditions detected by the monitor trigger unit 1606. For example, a single ended monitoring of the voltage on the VB or GB connection can be triggered to occur over a functional stacked die operation defined by a start and stop condition or a single ended monitoring a voltage on a selected AS connection can be triggered to occur over a functional stacked die operation defined by a start and stop condition. Monitoring the VB or GB connection allows testing that the voltages on the VB or GB remain at acceptable levels during power intensive functional operations of the stacked die. Monitoring an AS connection allows testing that the analog voltage signals on the connection are operating properly and within specification during a functional operation of the stacked die.

Figure 40:
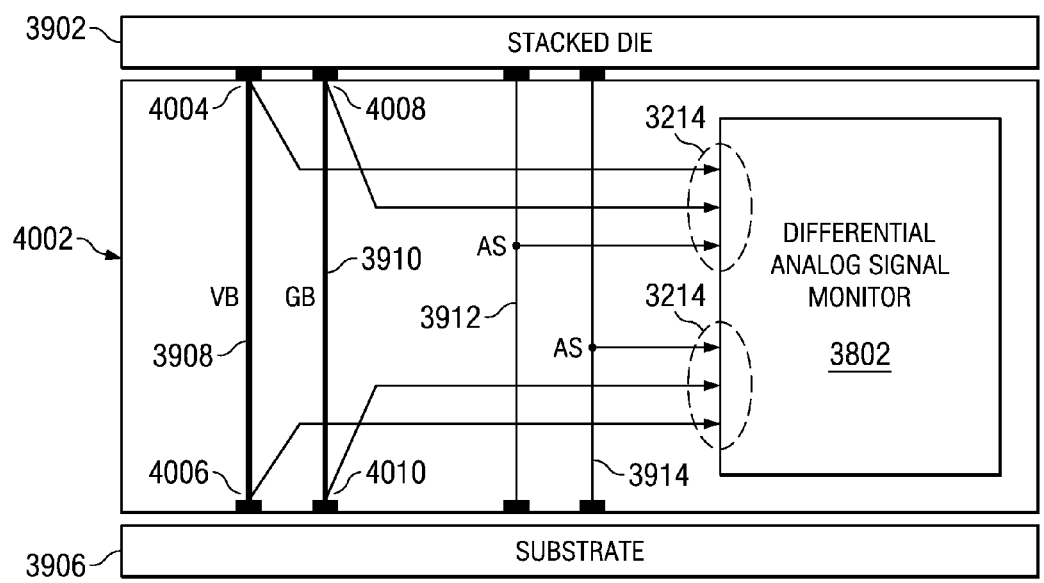
FIG. 40 illustrates a differential analog signal monitor in an interposer.

FIG. 40 illustrates a stacked die 3902 mounted on an interposer 4002 which is mounted on a substrate 3906. The interposer provides a voltage bus (VB) 3908, ground bus (GB) 3910 and functional interconnects, including analog signal (AS) interconnects 3912 and 3914. The interposer includes the differential analog signal monitor 3802 of FIG. 38. First selectable inputs 3214 of analog monitor 3802 are connected to the VB 3908 at contact point 4004, GB 3910 at contact point 4008 and AS 3912. Second selectable inputs 3214 of analog monitor 3802 are connected to the VB 3908 at contact point 4006, GB 3910 at contract point 4010 and AS 3914. Contact point 4004 is the VB connection in close proximity to stacked die 3902 and contact point 4006 is the VB connection in close proximity to substrate 3906. Contact point 4008 is the GB connection in close proximity to stacked die 3902 and contact point 4010 is the GB connection in close proximity to substrate 3906. When enabled by monitor trigger unit 1606, monitor 3802 operates to sample, digitize and store differential voltage levels selected on the first and second inputs 3214. The VB voltage levels at contact points 4004 and 4006 may be selected to allow monitoring the voltage differences occurring in time between points 4004 and 4006 to determine the voltage drop on the VB bussing path 3908. The GB voltage levels at contact points 4008 and 4010 may be selected to allow monitoring the voltage differences occurring in time between points 4008 and 4010 to determine the voltage drop on the GB bussing path 3910. AS 3912 and AS 3914 may selected to allow monitoring the voltage differences occurring in time between AS 3912 and AS 3914. When the differential monitoring operation ends, the stored digital representations of the sampled differential voltages can be shifted out of the monitors memory for examination, via the interposer TAP 204.

The differential analog signal monitoring of FIG. 40 can be triggered to start and stop during selected functional start and stop conditions detected by the monitor trigger unit 1606. For example, a differential monitoring of the voltage drop across the VB or GB connection can be triggered to occur over a functional stacked die operation defined by a start and stop condition or a differential monitoring of the voltages occurring on two selected AS connections can be triggered to occur over a functional stacked die operation defined by a start and stop condition. Differentially monitoring the voltage drops across the VB or GB connection allows testing that the voltage drops remain within acceptable levels during power intensive functional operations of the stacked die. Further, by knowing the resistance of the VB and GB connections, the supply and ground currents through the connections may be determined by Ohm's Law. By knowing the current through and the voltage drop across a VB or GB, power monitoring can be performed during a selected functional operation of the die stack. Differentially monitoring the voltages on two AS connections allows testing that the analog signals are operating properly and within specification during a functional operation of the stacked die.

Figure 41:
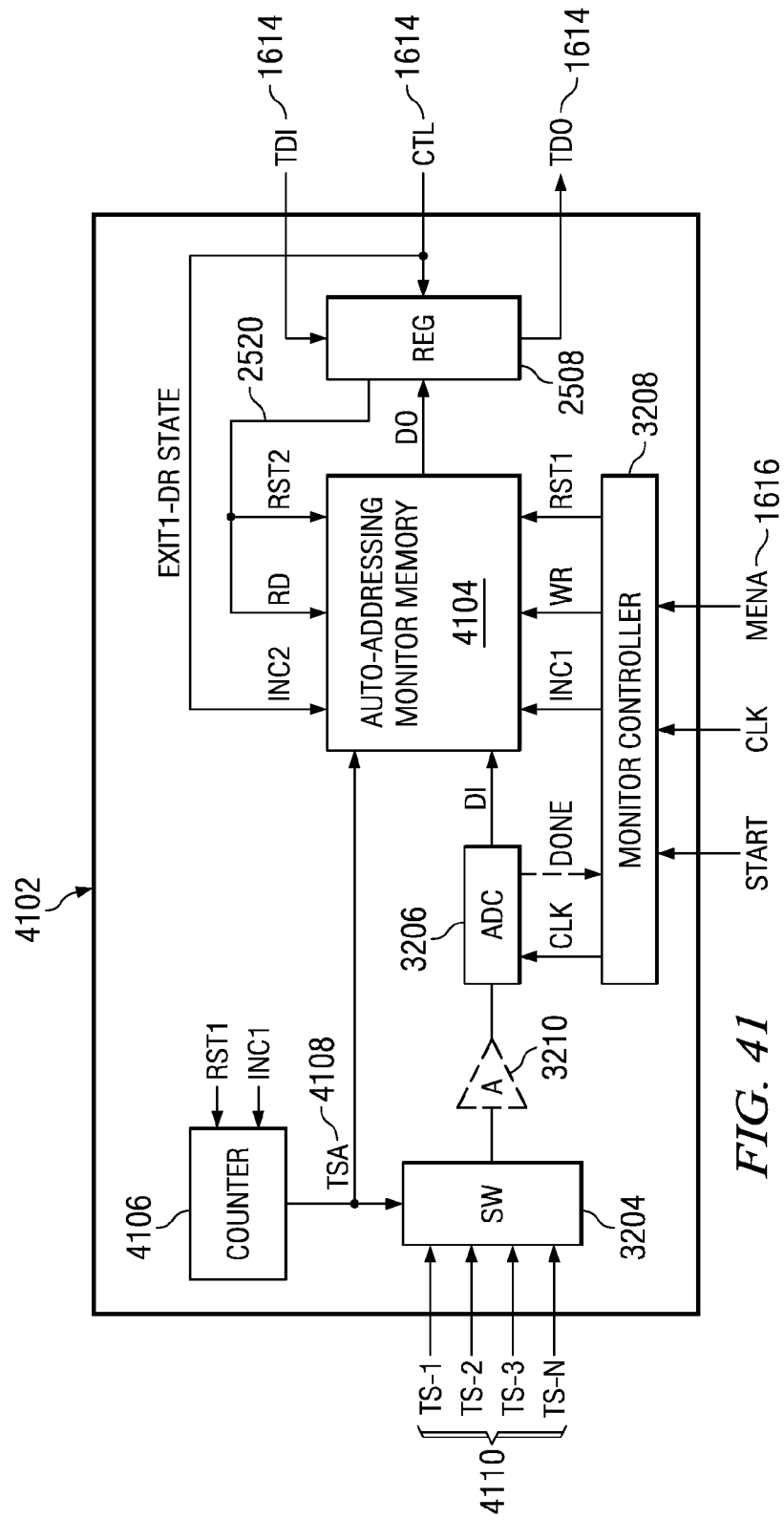
FIG. 41 illustrates a monitor for monitoring temperature sensors.

FIG. 41 illustrates a monitor 4102 wherein in the purpose is to monitor temperature sensor (TS) outputs 4110. The outputs may come from any type of TS such as those mentioned in regard to FIG. 18. Monitor 4102 is the same as monitor 3202 with the exception that it includes a counter 4106 and a modified auto-addressing monitor memory 4104. The counter 4106 has inputs for the RST1 and INC1 signals from controller 3208 and temperature sensor address (TSA) outputs. The TSA outputs are input to analog switch (SW) 3204 in substitution of the MISEL inputs of FIG. 32. Each TSA count pattern controls SW 3204 to select one of the TS outputs to be input to the ADC 3206. The TSA count patterns are also input to additional inputs provided on monitor memory 4104 to allow identifying which TS is currently being selected for a temperature measurement. When enabled, the monitor controller state machine 3208 operates to control the ADC 3208 and monitor memory 4104 as previously described. The monitor controller state machine 3208 also controls counter 4106 using the RST1 and INC1 signals. Depending on the type of ADC being used, the monitor controller state machine operates according to one of the operational diagrams of FIGS. 34-37. The operation of temperature sensor monitor 4102 is described below using the operational state diagram of FIG. 34 as one example.

As seen in the operational diagram of FIG. 34, state machine 3208 will initially be in an Idle state 3402 waiting for the MENA signal to be asserted. When MENA is asserted the state machine transitions to state 3404 to output a RST1 signal to reset the address counter 2604 of monitor memory 4104 and counter 4106 to starting addresses. From state 3404 the state machine transitions to state 3406 where it polls for a Start signal. When the Start signal occurs, the state machine transitions to state 3408 where it outputs a CLK signal to ADC 3206. In response to the CLK signal, ADC 3206 samples the analog output of the currently addressed TS, digitizes the sampled signal and outputs a parallel digital representation of the analog signal to the parallel inputs of memory 4104. From state 3408 the state machine transitions to state 3410 where it outputs a WR signal to monitor memory 4104. In response to the WR signal, monitor memory 4104 stores the parallel outputs of ADC 3206 and the current TSA output from the counter 4106. From state 3410 the state machine transitions to state 3412 where it outputs an INC1 signal to address counter 2604 of the monitor memory 4104 to select the next memory location to be written too and to counter 4106 to increment the TSA counter 4106 to the next count pattern to select the next TS to be measured. If the Start signal is still asserted, the state machine transitions back to state 3408 to repeat the CLK, WR and INC1 state operations. When the TSA counter 4106 reaches a maximum count it wraps around to the starting count and continues counting. If the Start signal is de-asserted, the state machine transitions to state 3406 to wait for either another Start signal or the MENA signal to be de-asserted.

At the end of a monitoring operation, register 2508 is accessed by the interposer TAP, via bus 1614, to read out the contents of the monitor memory locations. Each location read will contain data from a TS measurement and the address (the TSA output of counter 4106) of the TS that was measured.

Figure 42:
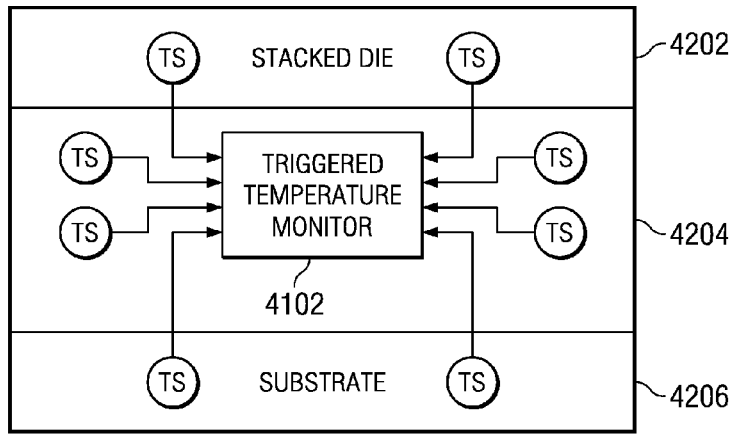
FIG. 42 illustrates a temperature sensor monitor in an interposer.

FIG. 42 illustrates a stacked die 4202 mounted on an interposer 4204 which is mounted on a substrate 4206. The interposer 4204 contains a temperature monitor 4102 with inputs coupled to temperature sensors (TS). As seen the TS's can exist in the interposer, the substrate, and/or in die of the die stack. When enabled and a start condition occurs, the temperature monitor cycles through the steps of addressing each TS and sampling, digitizing and storing its output. This operation continues until the start condition goes away. At the end of a temperature monitoring operation, the stored TS temperature measurements and TS addresses of each are read out of temperature monitor 4102 by the interposer TAP 204 for examination.

Figure 43:
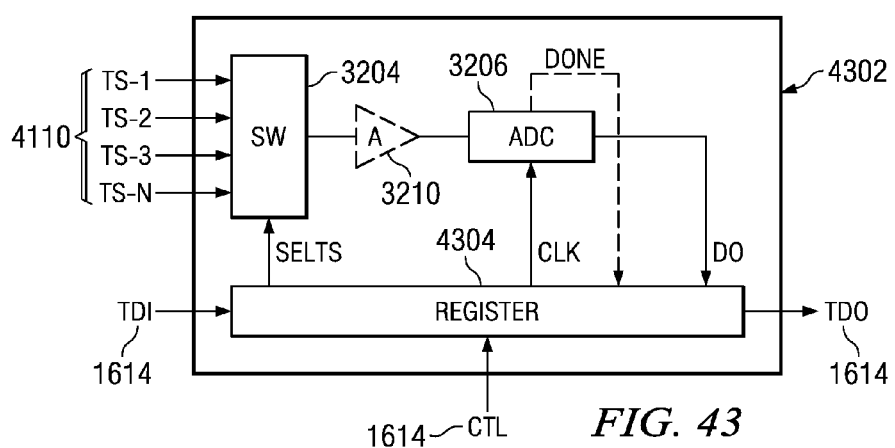
FIG. 43 illustrates a TAP controlled temperature sensor monitor.

FIG. 43 illustrates an example of a TAP controlled temperature monitor 4302 that includes a SW 3204, an ADC 3206, optional amplifier (A) 3210 and a TAP controlled register 4304. Temperature monitor 4302 differs from the temperature monitor 4102 in that the interposer TAP controls the operation of monitor 4302 instead the trigger unit 1606. SW 3204 has TS inputs 4110, select temperature sensor (SELTS) inputs for selecting a TS for measurement and an output coupled to an input of the ADC. Register 4304 has SELTS outputs coupled to the SELTS inputs of SW 3204, a CLK output coupled to the ADC, an optional Done input from the ADC and inputs for inputting the data output (DO) from the ADC. Register 4304 is coupled to the TDI, CTL and TDO signals of bus 1614 to allow the TAP to access register 4304 to control the operation of temperature monitor 4302.

To obtain a temperature measurement from one of the TS 1-N, the TAP performs one or more scan operations to register 4304 to shift in and update data on the SELTS outputs to select a TS1-N for measurement and to enable a CLK to be output from register 4304 to start the measurement. The CLK output from register 4304 needs to occur after the SELTS signals have been set to select a TS for measurement. This can be achieved in different ways, including, but not limited to, the following two ways. A first way is to perform a first scan operation of register 4304 to update the SELTS outputs to select a TS for measurement, followed by a second scan operation of register 4304 to assert the CLK output to start the measurement process. A second way is to do a single scan operation to register 4304 that updates the SELTS outputs to select a TS for measurement and also asserts the CLK output to start the measurement process. In the second way, register 4304 must be adapted with circuitry that delays the assertion of the CLK output until after the SELTS outputs have set to select a TS1-N for measurement.

In this example, the ADC 3206 is assumed to be self timed (i.e. it has an internal clock/oscillator) after receiving the CLK input from the register. The ADC may or may not include a Done output signal. If it includes a Done output signal, the TAP will repeatedly scan the register to capture and shift out the value of the Done signal and the DO from the ADC. When the Done signal is asserted, the DO values scanned out will be the TS measurement data. If the ADC does not require a Done signal, i.e. the self timed ADC operation is fast enough to occur well before the next TAP scan operation to register 4304, the DO value captured and shifted out on the next scan operation will be the TS measurement data.

Figure 44:
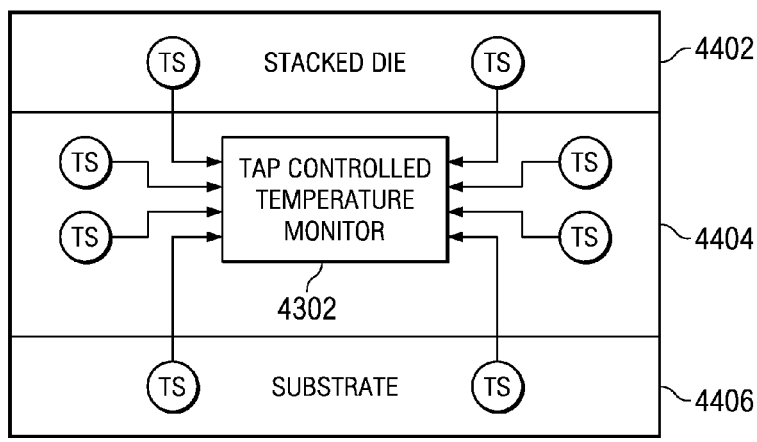
FIG. 44 illustrates a TAP controlled temperature sensor monitor in an interposer.

FIG. 44 illustrates a stacked die 4402 mounted on an interposer 4404 which is mounted on a substrate 4406. The interposer 4404 contains a temperature monitor 4302 with inputs coupled to temperature sensors (TS). As seen the TS's can exist in the interposer, the substrate, and/or in die of the die stack. When controlled by the interposer TAP, the temperature monitor 4302 can address one of the TS inputs and sample, digitize and shift out the temperature measurement from the TS. The advantage of the temperature monitor 4303 over temperature monitor 4102 is simplicity. The disadvantage is that the temperature monitoring cannot be synchronized to occur in response to a specific functional operation of stacked die 4402, as can the temperature sensor 4102 of FIG. 41.

While the monitor trigger unit 1606 and monitors 1608-1612 of the disclosure have been described as being used within interposers, it should be understood that the monitor trigger unit 1606 and monitors 1608-1612 could be used within a die or within an embedded core located within a die.

Figure 45:
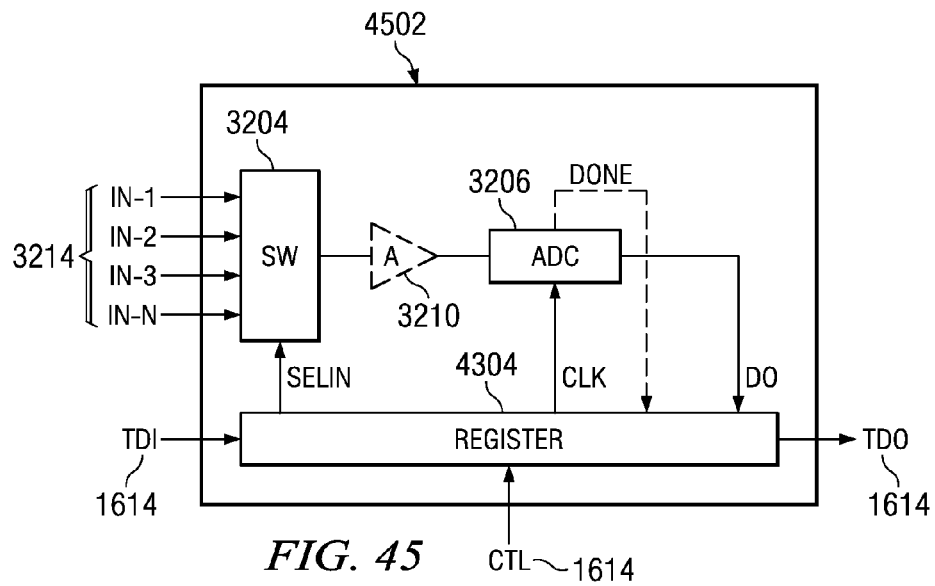
FIG. 45 illustrates a TAP controlled single ended analog signal monitor.

FIG. 45 illustrates a singled ended TAP controlled analog signal monitor 4502 that can be used to sample, digitize and output analog signals. Monitor 4502 is the same as monitor 4302 with the exception that SW 3204 is coupled to analog signal inputs (IN-1-) 3214 instead of to temperature sensor outputs. Monitor 4502 can be used in substitution of the trigger unit controlled monitor 3202 of FIG. 39 to measure single ended voltages on interposer VB, GB and AS signals.

Figure 46:
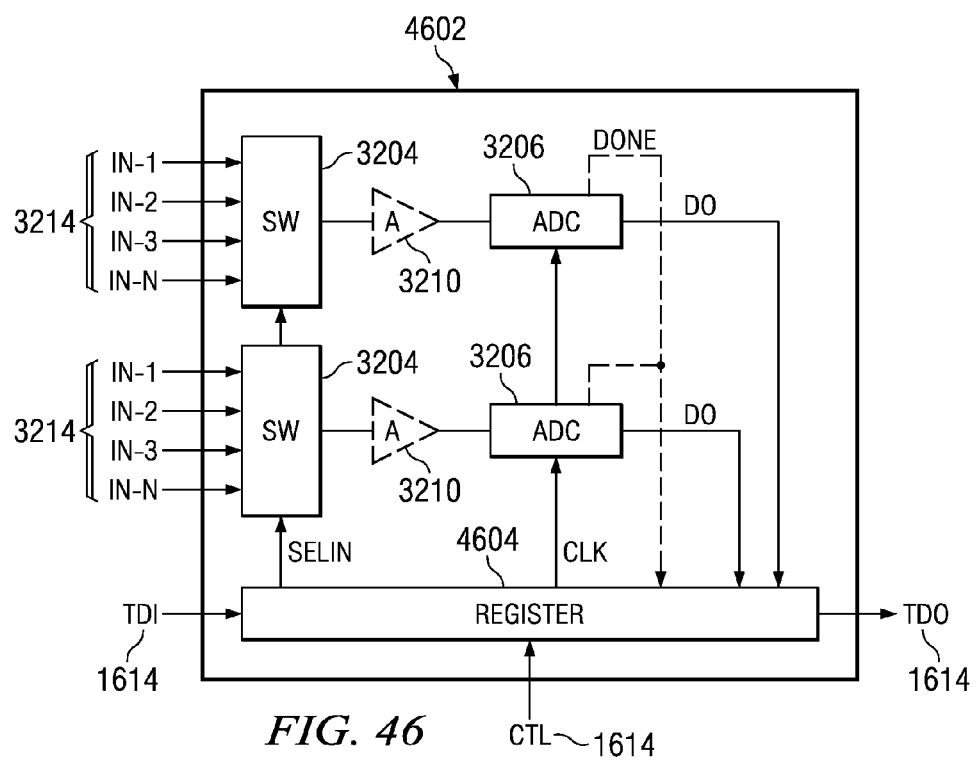
FIG. 46 illustrates a TAP controlled differential analog signal monitor.

FIG. 46 illustrates a differential TAP controlled analog signal monitor 4602 that can be used to sample, digitize and output differential analog signals. Monitor 4602 is the same as monitor 4502 with the exception that it includes two switches (SW) 3204 each having inputs (IN1-N) 3214 for inputting analog signals, two ADCs 3206 and a register having parallel inputs for the data outputs (DO) of both ADCs. Monitor 4602 can be used in substitution of the trigger unit controlled monitor 3802 of FIG. 40 to measure differential voltages on interposer VB, GB and AS signals.

While the monitor trigger unit 1616, trigger controlled monitors 1608-1612 and TAP controlled monitors 4302, 4502 and 4602 have been described being used within interposers, it should be understood that they are not limited to only being used within interposers. As described in FIG. 47 below, they can also be used within die or embedded cores within die.

Figure 47:
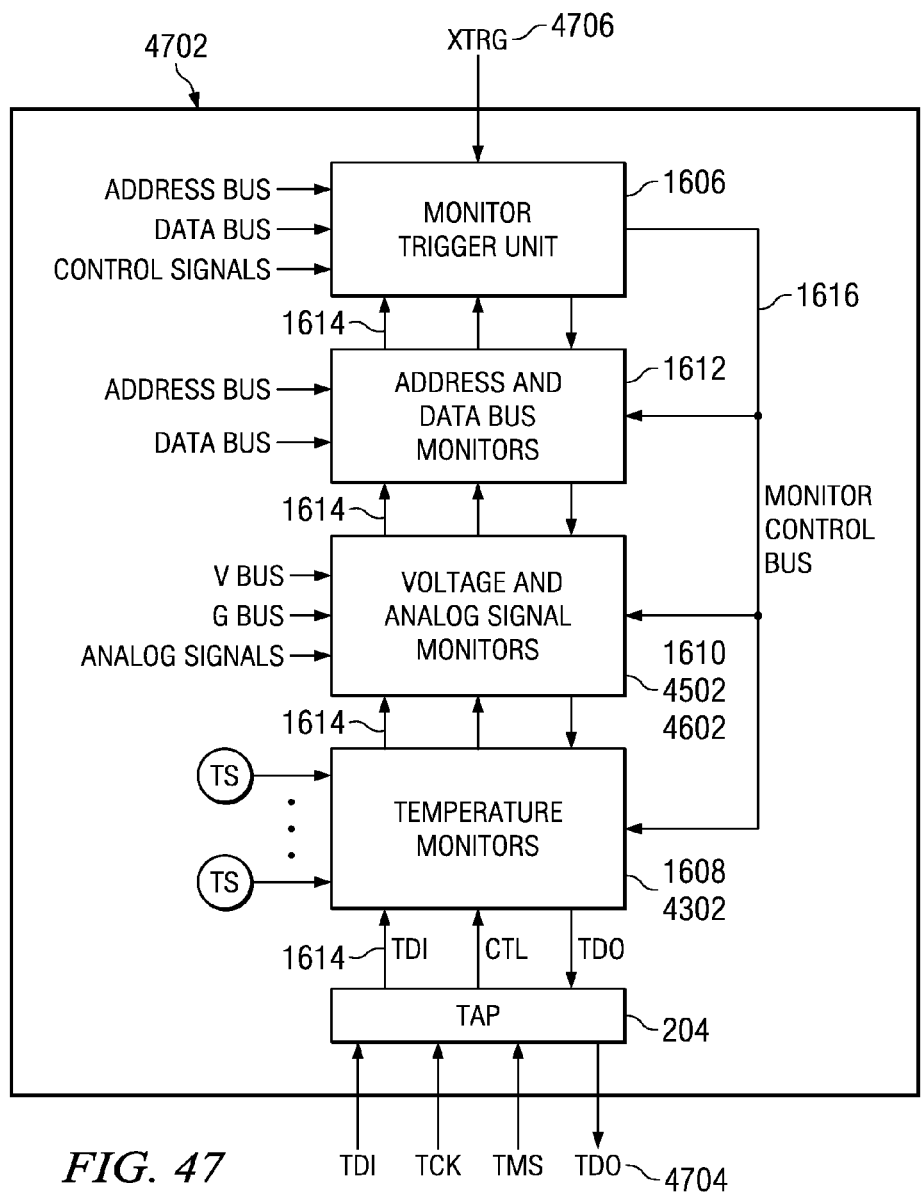
FIG. 47 illustrates the monitor trigger unit and monitors of the disclosure being used within a die or embedded core within a die.

FIG. 47 illustrates a die or embedded core 4702 which includes the monitor trigger unit 1606, address & data bus monitors 1612, voltage & analog signal monitors 1610, 4502 and 4602 and temperature monitors 1608 and 4302. The monitor trigger unit and monitors operate in the die or embedded core 4702 as they have been described operating in interposers. The monitor trigger unit and monitors are coupled to a TAP 204 within the die or embedded core 4702 via bus 1614. The TAP is interfaced to external TDI, TCK, TMS and TDO signals on the die or embedded core 4702. The monitor trigger unit is coupled to an address bus, a data bus and control signals located within the die or embedded core 4702. Also, monitor trigger unit may be interface to an external XTRG signal 4706 of the die or embedded core 4702. Monitor 1612 is coupled to an address bus and a data bus located within the die or embedded core 4702. Monitors 1610, 4502 and/or 4602 are coupled to a V Bus, a G Bus and analog signals located within the die or embedded core 4702. Monitors 1608 and/or 4302 are coupled to temperature sensors (TS) located within the die or embedded core 4702. Trigger unit controlled monitors operate in response to the monitor control bus 1616 as has been described. TAP controlled monitors operate in response to TAP control as has been described.

Figure 48:
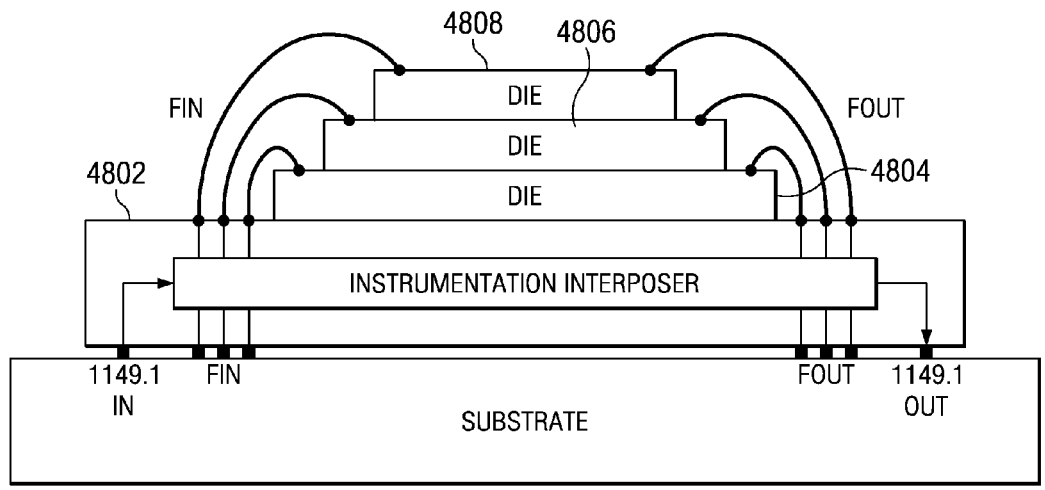
FIG. 48 illustrates the instrumentation interposer of the disclosure located between a wire bonded stack of die and a substrate.

FIG. 48 illustrates the use of an instrumentation interposer of the disclosure being used with a stack of die 4804-4808 that are connected to the interposer via bond wires. The instrumentation interposer operates as previously described to access and control monitoring instruments within the interposer.

Figure 49:
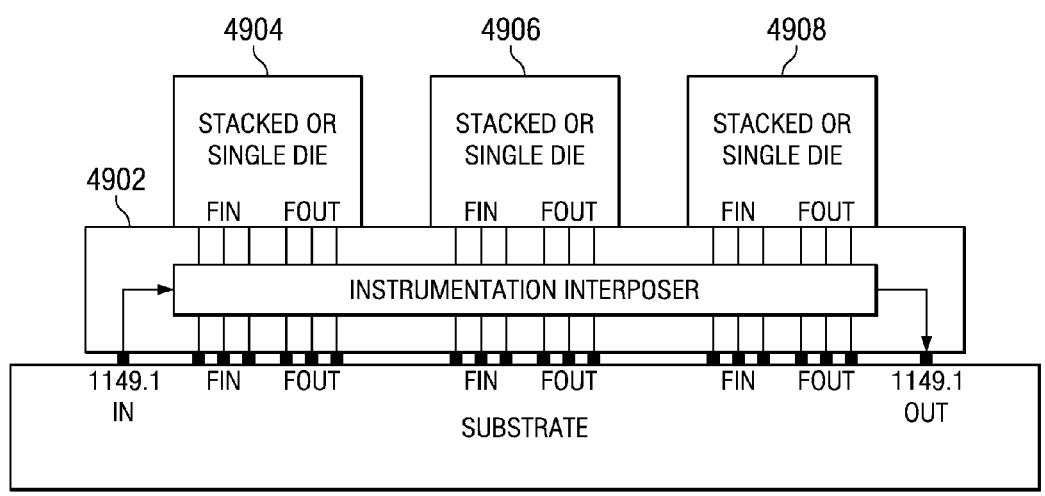
FIG. 49 illustrates the instrumentation interposer of the disclosure located between a group of one or more stacked or single die and a substrate.

FIG. 49 illustrates a group of one or more stacked or single die 4904-4908 located on an instrumentation interposer 4902 of the disclosure. The instrumentation interposer operates as previously described to access and control monitoring instruments within the interposer.

Although the disclosure has been described in detail, it should be understood that various changes, substitutions and alterations may be made without departing from the spirit and scope of the disclosure as defined by the appended claims.

What is claimed is:

1. An interposer comprising:
    A. a test access port having a test data input lead, a test data output lead, a test clock lead, a test mode select lead, and test control leads;
    B. functional circuitry leads;
    C. monitor trigger circuitry having inputs coupled to the functional circuitry leads, the test data input lead, and the test control leads, and having an output coupled to the test data output lead, and monitor control outputs; and
    D. monitor circuitry having inputs coupled to the functional circuitry leads, to the monitor control outputs, an input coupled to the test data input lead, an input coupled to the test control leads, and an output coupled to the test data output lead.

2. The interposer of claim 1 in which the test access port includes state machine circuitry having inputs coupled with the test clock lead and the test mode select lead, and having state outputs coupled with the test control leads.

3. The interposer of claim 1 including a silicon substrate having top and bottom surfaces and in which the functional circuitry leads include through silicon vias coupling leads on the top and bottom surfaces of the substrate.

4. The interposer of claim 1 including a silicon substrate having top and bottom surfaces and in which the test data input lead, the test data output lead, the test clock lead, and the test mode select lead include through silicon vias coupling leads on the top and bottom surfaces of the substrate.

5. The interposer of claim 1 including a silicon substrate having top and bottom surfaces and in which the functional circuitry leads include through silicon vias coupling leads on the top and bottom surfaces of the substrate and in which the test data input lead, the test data output lead, the test clock lead, and the test mode select lead include through silicon vias coupling leads on the top and bottom surfaces of the substrate.

* * * * *